(12) United States Patent
Hirasawa

(10) Patent No.: US 6,548,880 B1
(45) Date of Patent: Apr. 15, 2003

(54) OPTICAL SEMICONDUCTOR DEVICE AND A METHOD OF MANUFACTURING THE SAME

(75) Inventor: Koki Hirasawa, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 0 days.

(21) Appl. No.: 09/635,473

(22) Filed: Aug. 11, 2000

(30) Foreign Application Priority Data

Aug. 13, 1999 (JP) .......................................... 11-229024

(51) Int. Cl.$^7$ .......................................... H01L 31/0203
(52) U.S. Cl. .......................... 257/433; 257/414; 257/81; 257/82
(58) Field of Search .......................... 257/81, 82, 414, 257/433, 690, 701, 704, 723

(56) References Cited

U.S. PATENT DOCUMENTS

| 5,220,198 A | * | 6/1993 | Tsuji .......................... 257/731 |
| 5,647,034 A | * | 7/1997 | Matsuda et al. .............. 385/16 |
| 5,770,867 A | * | 6/1998 | Sata et al. .................... 257/81 |

FOREIGN PATENT DOCUMENTS

| JP | 0661522 A | * | 3/1994 |
| JP | 7-303083 | | 11/1995 |
| JP | 8-264823 | | 10/1996 |
| JP | 08264823 | * | 10/1996 |

* cited by examiner

Primary Examiner—Nathan J. Flynn
Assistant Examiner—Leonardo Andújar
(74) Attorney, Agent, or Firm—Sughrue Mion, PLLC

(57) ABSTRACT

A first conductive layer is formed on the bottom surface of a substrate, including a bottom section, a step and a side wall, and a light emitting device is mounted on the first conductive layer. A second conductive layer is formed on the step, and is electrically connected to the fight emitting device. The substrate is filled with a translucent resin. A third and fourth conductive layers, which are insulated from each other, are formed on a cap in the form of plate which is attached to an opening of the substrate. A photodetector facing the light emitting device is mounted on the third conductive layer, thereby the light emitting device and the fourth conductive layer are electrically connected with each other. The conductive layers are respectively connected to external electrodes, which are formed on the external surface of the substrate, via through holes formed through the substrate.

16 Claims, 22 Drawing Sheets

OPTICAL SEMICONDUCTOR DEVICE AND A METHOD OF MANUFACTURING THE SAME

BACKGROUND OF THE INVENTION

1. Field of the Invention

The present invention relates to an optical semiconductor device including a light emitting device and a photodetector, and more particularly to an optical semiconductor device as a chip-type photocoupler or as an optical integrated circuit device and a method of manufacturing the optical semiconductor device.

2. Description of the Related Art

Unexamined Japanese Patent Application KOKAI Publication No. H8-264823 discloses, for example, two types of conventional optical semiconductor devices, as chip-type photocouplers, each includes a light emitting device and a photodetector, which are mounted on a concaved-type resin substrate and are sealed with a translucent resin which is coated with a light-shielding resin. In such a conventional optical semiconductor device, light emitted from the light emitting device passes through the translucent resin, and reflected on the interface between the translucent resin and the light-shielding resin so as to be detected by the photodetector.

Another optical semiconductor device disclosed in the above patent publication includes the first concaved-type resin substrate, on which a light emitting device is mounted and sealed with a translucent resin, and the second concaved resin substrate, on which a photodetector is mounted and is sealed with a translucent resin. In this optical semiconductor device, the first and second concaved-type resin substrates are connected with and face each other so that a light emitting surface of a light emitting device faces the photodetection surface of the photodetector. The light emitted from the photodetector passes through the translucent resin filling both concaved-type resin substrates, and detected by the photodetector.

Disclosed in Unexamined Japanese Patent Application KOKAI Publication No. H7-303083 is an optical semiconductor device having the structure of an optical integrated circuit. In this optical semiconductor device, a light emitting device and a photodetector are mounted on a wiring substrate, and a transparent plate covers the wiring substrate. In the optical semiconductor device, the light emitted from the light emitting device is reflected on the transparent plate and detected by the photodetector.

As described above, one of the optical semiconductor devices, disclosed in Unexamined Japanese Patent Application KOKAI Publication No. H8-264823, includes the light emitting device and the photodetector sealed with the translucent resin which is coated with the light shielding resin. In this structure, if the interface between the translucent resin and the light-shielding resin is defective, the reflection direction of the light deviates from a desired direction, and the efficiency of the photodetection in the photodetector is low. In the structure where the light emitting device and the photodetector are arranged on one plane, the area of the optical semiconductor device is large, thus optical semiconductor devices can not be mounted with high density.

In another optical semiconductor device, disclosed in Unexamined Japanese Patent Application KOKAI Publication No. H8-264823, wherein two concaved-type resin substrates are included, a physical interface exists between both concaved-type resin substrates filled with the translucent resin. In this structure, light is reflected on this interface and scattered in directions. As a result of this, the efficiency of the photodetection in the photodetector is low. In the case where both concaved-type resin substrates are not completely adhered to each other and air bubbles are generated in the interface therebetween, the withstanding voltage between the light emitting device and the photodetector is low, and the resistance of the device is also low.

Further, in the optical semiconductor device disclosed in Unexamined Japanese Patent Application KOKAI Publication No. H8-264823, the light emitting device and the photodetector are electrically connected with the substrate through bonding wires. In order to prevent the bonding wires from being broken down, the curvature of the loop needs to be low. As u result, the chip is made large in height. In the structure where the chip is made large in height, the optical path length between the light emitting device and the photodetector is large, and the translucent resin fills the space between the light emitting device and the photodetector, thus the light passing through the translucent resin is attenuated. In addition, scattering of the light occurs in the structure where the translucent resin fills the space between the two. Thus, the efficiency of the photodetection of the photodetector is low.

In the optical semiconductor device disclosed in Unexamined Japanese Patent Application KOKAI Publication No. H7-303083, the light emitting device and the photodetector are mounted on one plane. The area where to mount the photocoupler including the light emitting device and the photodetector is large, thus optical semiconductor devices can hardly be mounted with high density.

SUMMARY OF THE INVENTION

The present invention has been made in consideration of the above problems. It is accordingly an object of the present invention to provide an optical semiconductor device as a photocoupler having a chip structure in small size, and a method of manufacturing the same.

Another object of the present invention is to provide an optical semiconductor device with high efficiency of photocoupling, and a method of manufacturing the same.

Still another object thereof is to provide an optical semiconductor device, a plurality of which can be mounted with high density, and method of manufacturing the same.

In order to achieve the above objects, an optical semiconductor device may comprising:

a substrate having an opening, in a form of container;

a conductive layer for substrate which is formed on a bottom surface of the substrate;

a plurality of external electrodes which are formed on an external surface of the substrate and to be clerically connected to an external circuit;

a light emitting device or photodetector which is mounted on the conductive layer for substrate and electrically connected to the conductive layer and the external electrodes;

a cap which is fixed to the opening of the substrate;

a conductive layer for cap which is formed on a surface facing the light emitting device or photodetector; and a photodetector or light emitting device, which is mounted on the conductive layer for cap, and electrically connected the conductive layer for cap and the plurality of external electrodes, and which faces the light emitting device or photodetector mounted on the substrate.

In the optical semiconductor device, a space throughout the substrate and the cap may be filed with a translucent resin.

A through hole for substrate, for connecting the conductive layer for substrate and the plurality of external electrodes, may be formed in the substrate; and the through hole may be filled with a conductive material.

Further, a through hole for cap, for connecting the conductive layer for cap and the plurality of electrodes, may be formed in the substrate; and the through hole for cap may be filled with a conductive material.

The substrate may comprise a bottom section and a side wall arranged on a peripheral section of the bottom section; and the plurality of external electrodes may be formed on the bottom surface of the substrate.

The cap may comprise a flat surface section and a side surface section;

the plurality of external electrodes may be arranged on the side wall section of the substrate and on the side surface section.

The substrate may have a multi-layer structure;

a first conductive layer may be formed on a predetermined layer of the substrate;

the light emitting device or photodetector may be formed on the first conductive layer;

a second conductive layer may be formed on a layer being at a same height as a height of a surface of the light emitting device or photodetector formed on the first conductive layer; and the light emitting device or photodetector and the second conductive layer may electrically he connected with each other through a bonding wire.

The plurality of external electrodes may be formed on the external surface of the substrate and on an external surface of the cap;

the plurality of external electrodes which are formed on the external surface of the substrate, and the plurality of external electrodes which are formed on the external surface of the cap may be arranged on a same plane;

the plurality of external electrodes which are formed on the external surface of the substrate may electrically be connected to the light emitting device or photodetector on the conductive layer for substrate; and the plurality of external electrodes which are formed on the external surface of the cap may electrically be connected to the photodetector or light emitting device on the conductive layer for cap.

An optical semiconductor device according to the second aspect of the present invention may comprise:

a wiring substrate, on which a conductive layer for substrate having a predetermined wiring pattern is formed, and which has a plurality of openings in predetermined positions;

a plurality of external electrodes which art formed on an external surface of the wiring substrate and to be electrically connected to an external circuit;

a light emitting device or photodetector which is mounted on the conductive layer for substrate and electrically connected to the conductive layer and the external electrodes;

a cap which is fixed to each of the openings of the substrate;

a conductive layer for cap which is formed on E surface facing the light emitting device or photodetector; and a photodetector or light emitting device, which is mounted on the conductive layer for cap, and electrically connected to the conductive layer for cap and the plurality of external electrodes, and which faces the light emitting device or photodetector mounted on the substrate.

In the optical semiconductor device, a space throughout the each of the plurality of openings and the cap may be filled with a translucent resin.

A through hole for substrate, for connecting the conductive layer for substrate and the plurality of external electrodes, may be formed in the substrate; and the through hole may be filled with a conductive material.

In the optical semiconductor device, a through hole for cap, for connecting the conductive layer for cap and the plurality of electrodes, may be formed in the substrate; and the through hole for cap may be filled with a conductive material.

The substrate may have a multi-layer structure;

a first conductive layer may be formed on a predetermined layer of the substrate;

the light emitting device or photodetector may be formed on the first conductive layer;

a second conductive layer may be formed on a layer being at a same height as a height of a surface of the light emitting device or photodetector formed on the first conductive layer; and the light emitting device or photodetector and the second conductive layer may electrically be connected through a bonding wire.

A method of manufacturing an optical semiconductor device according to the third aspect of the present invention may comprise:

forming a conductive layer on a bottom surface of a substrate, having an opening, in a form of container;

forming a plurality of external electrodes, which are to be electrically connected to an external circuit, on the external surface of the substrate;

mounting a light emitting device or photodetector on the conductive layer for substrate, and electrically connecting the conductive layer for substrate with the plurality of external electrodes;

forming a conductive layer for cap on one surface, facing the light emitting device or photodetector, of a cap fixed to the opening of the substrate;

mounting a photodetector or light emitting device facing the light emitting device or photodetector on the conductive layer for cap, and electrically connecting the photodetector or light emitting device with the conductive layer for cap; and attaching the cap to the opening of the substrate, and electrically connecting the photodetector or light emitting device mounted on the cap with the plurality of external electrodes.

The method of manufacturing an optical semiconductor device may comprise filling the opening of the substrate with a translucent resin, attaching the cap to the opening of the substrate with the translucent resin, and electrically connecting the photodetector or light emitting device mounted on the cap with the plurality of external electrodes, after the electrically connecting the conductive layer for substrate and the plurality of external electrodes.

The electrically connecting the conductive layer for substrate and the plurality of external electrodes may include:

forming a through hole for substrate, in the substrate, for electrically connecting the conductive layer for substrate with the plurality of external electrodes; and filling the through hole for substrate with a conductive material.

The electrically connecting the photodetector or light emitting device with the plurality of external electrodes may include:

forming a through hole for cap, in the substrate, for electrically connecting the conductive layer for cap and the plurality of external electrodes; and filling the through hole for cap with a conductive material.

The method of manufacturing an optical semiconductor device, may comprise:

forming the plurality of external electrodes on the external surface of the substrate;

electrically connecting the plurality of external electrodes formed on an external surface of the substrate with the light emitting device or photodetector on the conductive layer for substrate; and forming the plurality of external electrodes on the external surface of the cap;

electrically connecting the plurality of electrodes formed on the external surface of the cap with the photodetector or light emitting device on the conductive layer for cap; and attaching the external surface of the substrate, on which the plurality of electrodes are formed, to the external surface of the cap, on which the plurality of electrodes are formed, so that the external surface of the substrate and the external surface of the cap are formed on one surface of the optical semiconductor device.

A method of manufacturing an optical semiconductor device, according to the fourth aspect of the present invention may comprising:

forming, on a bottom surface of a wiring substrate, a conductive layer for substrate having a predetermined wiring pattern;

forming a plurality of openings in predetermined positions of the wiring substrate;

forming, on an external surface of the wiring substrate, a plurality of external electrodes which are to be electrically connected to an external circuit;

mounting a light emitting device or photodetector in each of the plurality of openings, and electrically connecting the conductive layer for substrate with the plurality of external electrodes;

forming a conductive layer for cap on a surface, facing the light emitting device or photodetector, of a cap which is fixed onto each of the plurality of openings;

mounting a photodetector or light emitting device facing the light emitting device or photodetector on the conductive layer for cap, and electrically connecting the photodetector or light emitting device with the conductive layer for cap; and attaching the cap to each of the plurality of openings, and electrically connecting the photodetector or light emitting device mounted on the cap with the plurality of external electrodes.

The method of manufacturing an optical semiconductor device, may comprise filling each of the plurality of openings with a translucent resin, attaching the cap to each of the plurality of openings with the translucent resin, and electrically connecting the photodetector or light emitting device mounted on the cap with the plurality of external electrodes, after the electrically connecting the conductive layer with the plurality of external electrodes.

The electrically connecting the conductive layer with the plurality of external electrodes may include:

forming a through hole for substrate, in the wiring substrate, for electrically connecting the conductive layer for substrate with the plurality of external electrodes.

The electrically connecting the photodetector or light emitting device with the plurality of external electrodes may include:

forming a through hole for cap, in the wiring substrate, for electrically connecting the conductive layer for cap with the plurality of external electrodes; and filling the through hole for cap with a conductive material.

BRIEF DESCRIPTION OF THE DRAWINGS

The objects and other objects and advantages of the present invention will become more apparent upon reading of the following detailed description and the accompanying drawings in which.

DETAILED DISCRETION OF THE PREFERRED EMBODIMENTS

Preferred embodiments of the present invention will now be described with reference to the accompanying drawings.

First Embodiment

Figure 1:
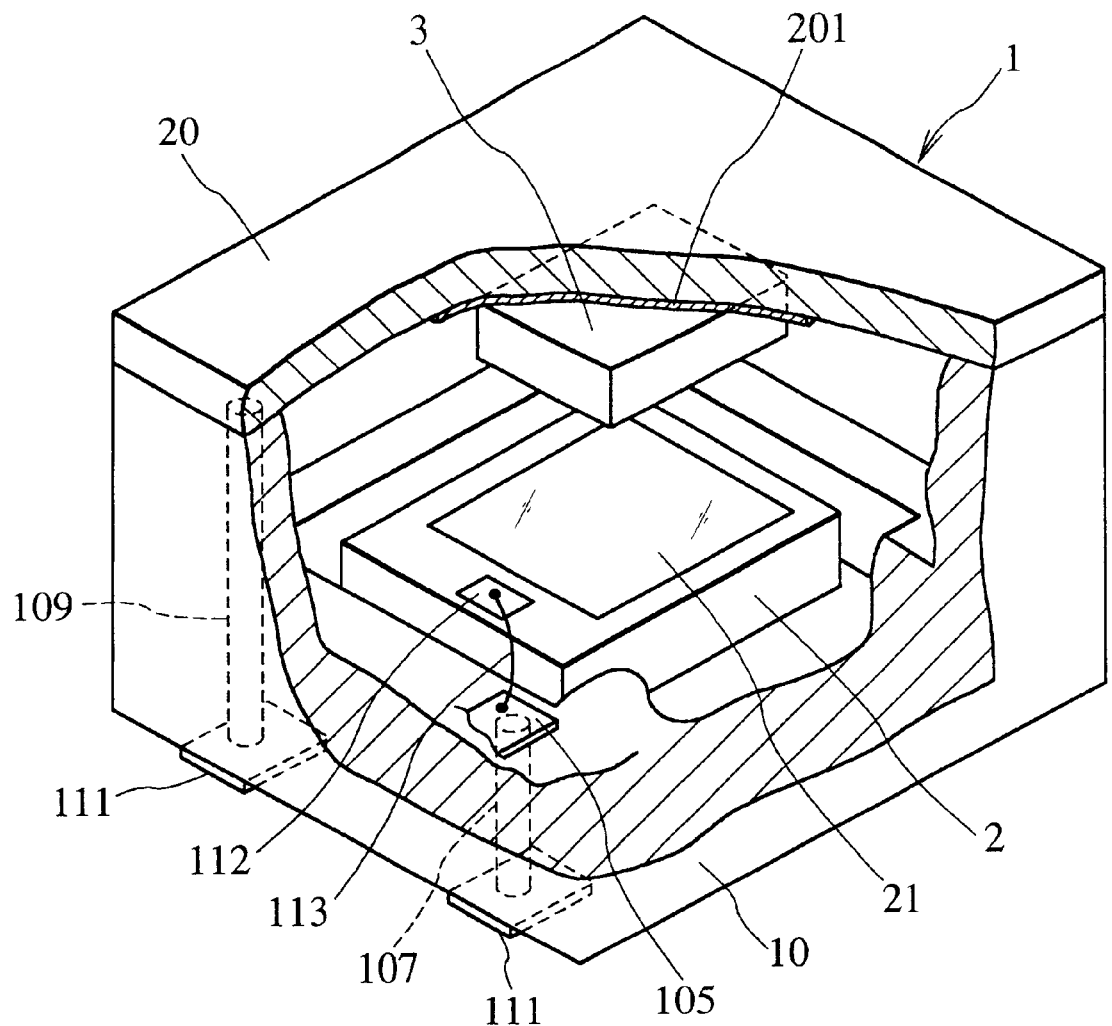
FIG. 1 is a perspective view of an optical semiconductor device according to the first embodiment of the present invention.
Figure 2A:
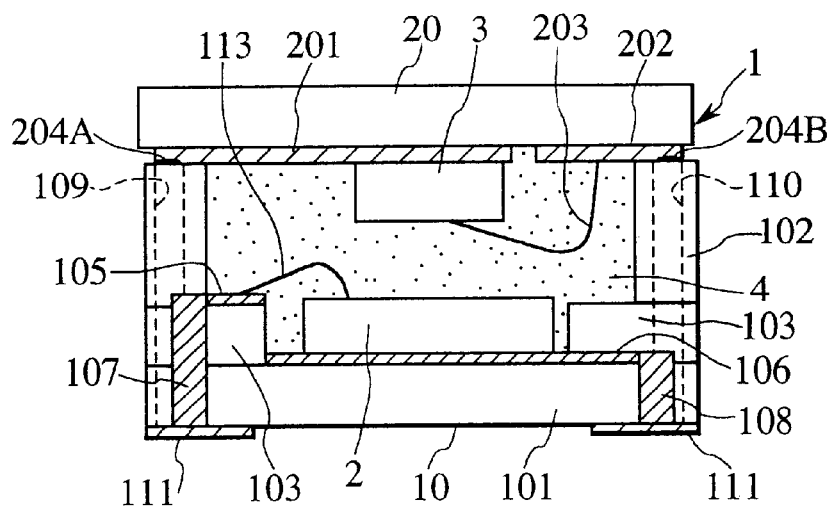
FIGS. 2A and 2B are a cross sectional view and a bottom view of the optical semiconductor device illustrated in FIG. 1.
Figure 2B:
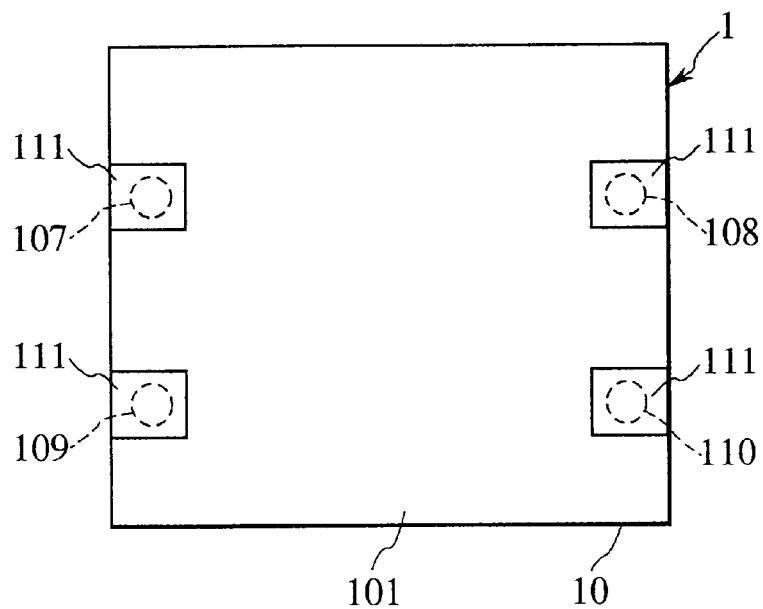

An optical semiconductor device according to the first embodiment of the present invention will now be explained with reference to the drawings. FIG. 1 is a perspective view of the optical semiconductor device 1, according to the first embodiment of the present invention. FIGS. 2A and 2B are a cross sectional view and a bottom view of the optical semiconductor device 1 shown in FIG. 1.

The optical semiconductor device 1 of this embodiment is a photocoupler and comprises, as illustrated in FIG. 1, a substrate 10 of a box type, which has an opening, and a cap 20 which covers (is attached to) the opening of the substrate 10.

As show in FIG. 2A, the substrate 10 comprises a bottom section 101, a step 103 which is formed along the peripheral section of the bottom section 101, and a side wall 102 which is arranged on the step 103. Conductive layers 106 and 105 are respectively formed on upper surfaces of the bottom section 101 and the step 103.

A through hole 108 connected to the conductive layer 106 is formed at one and of the bottom section 101 formed right under the step 103. The through hole 107 connected to the conductive layer 105 is formed at the other end of the bottom section 101 and at one end of the step 103. The through holes 109 and 110 penetrate through the bottom section 101, the side wall 102 and the step 103. The through holes 107, 108, 109 and 110 are filled with a conductive material such as metal.

External electrodes 111 are respectively connected to openings of the respective though holes 107 to 110. The conductive layers 105 and 106 are electrically connected to the external electrodes 111 respectively through the through holes 107 and 108 (more specifically, the conductive material filling the through holes 107 and 108).

A light emitting device 2 is mounted on the conductive layer 106. The conductive layer 106 and a semiconductor substrate (if the light emitting device 2 arc electrically connected with each other. The electrode 112 is electrically connected to the conductive layer 105 through a bonding wire 113. The electrode 112 of the light emitting device 2 and the conductive layer 105 of the step 103 are formed in such a way that their top surfaces are at the same height.

The substrate 10 is filled with a translucent resin 4.

Conductive layers 201 and 202 which are insulated from each other are formed on one surface of the cap 20. Bumps 204A and 204B are formed respectively on the conductive layers 201 and 202. When the cap 20 covers the opening of the substrate 10, the bumps 204A and 204B face the through holes 109 and 110.

A photodetector 3 on the surface of which an electrode 32 is formed is arranged on the surface of the conductive layer 201. The electrode 32 of the photodetector 3 is electrically connected to the conductive layer 202 through a bonding wire 23.

The cap 20 having the above structure is so ranged on the opening of the substrate as to cover the opening, and is fixed to the substrate 10 with the translucent resin 4 having sufficient adhesive strength to hold the cap 20.

In the photocoupler 1 including the substrate 10 and the cap 20, a light emitting surface 21 of the light emitting device 2 and a photodetection surface 31 of the photodetector 3 face each other. The conductive layers 201 and 202 which are electrically connected to the photodetector 3 are electrically connected wit the external electrodes 111 respectively via the through holes 109 and 110 (more specifically, via the conductive material in the through holes 109 and 110) arranged in the substrate 10.

A method of manufacturing the photocoupler 1 shown in FIGS. 1 to 2B will now be explained with reference to the drawings. A plurality of substrates 10 and caps 20 having the same structure arm formed in a matrix form, respectively. After the plurality of substrates 10 and caps 20 are formed in a matrix form, they are diced, thereby to form the individual substrates 10 and caps 20.

A method of forming the substrate 10 will now be explained with reference to FIGS. 3A to 6B.

Figure 3A:
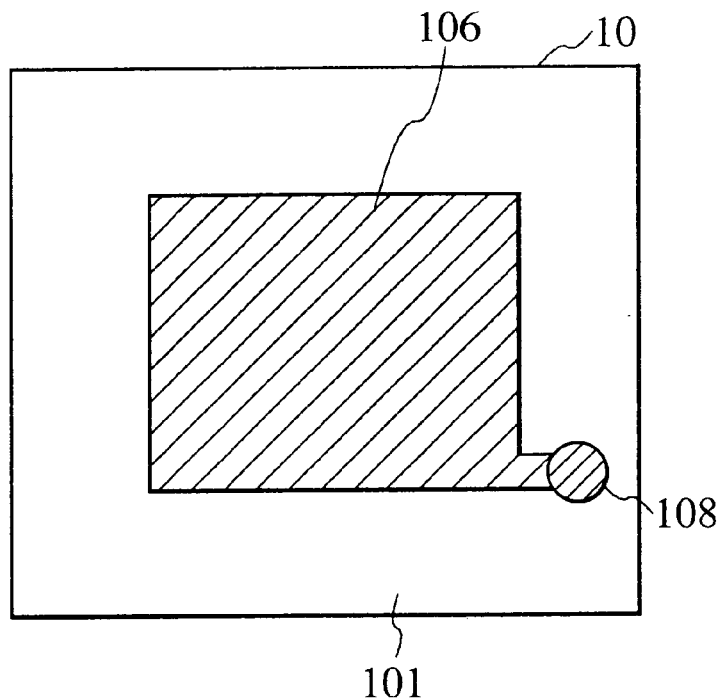
FIGS. 3A, 4A, 5A, 6A, 7A and 8A are top views of the optical semiconductor device, in a manufacturing process, illustrated in FIG. 1, FIGS. 3B, 4B, 5B, 6B, 7B and 9B are cross sectional views of the optical semiconductor device.
Figure 3B:
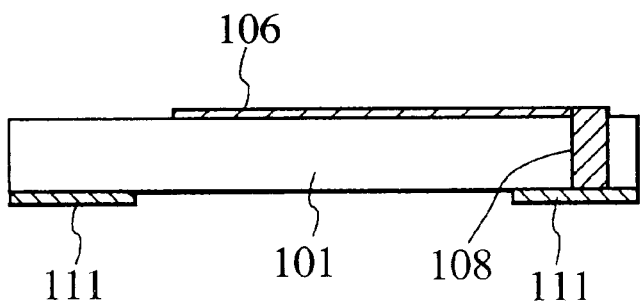

As described in FIGS. 3A and 3B, four external electrodes 111 are formed respectively in predetermined positions corresponding to the peripheral section of the surface of the bottom section 101 formed of a square-shaped plate which is formed from an insulating material, such as ceramic or a resin.

The through hole 108 is formed as to reach a predetermined one of the external electrodes 111. The inside of the through bole 108 is filled with a conductive material. The other surface of the bottom section 101 which differs from the one surface where the four external electrodes 111 arm formed is plated or metallized, thereby to form the conductive layer 106 having a predetermined shape. At this time, the conductive layer 106 is so formed as to be connected to the opening of the though hole 108.

Figure 4A:
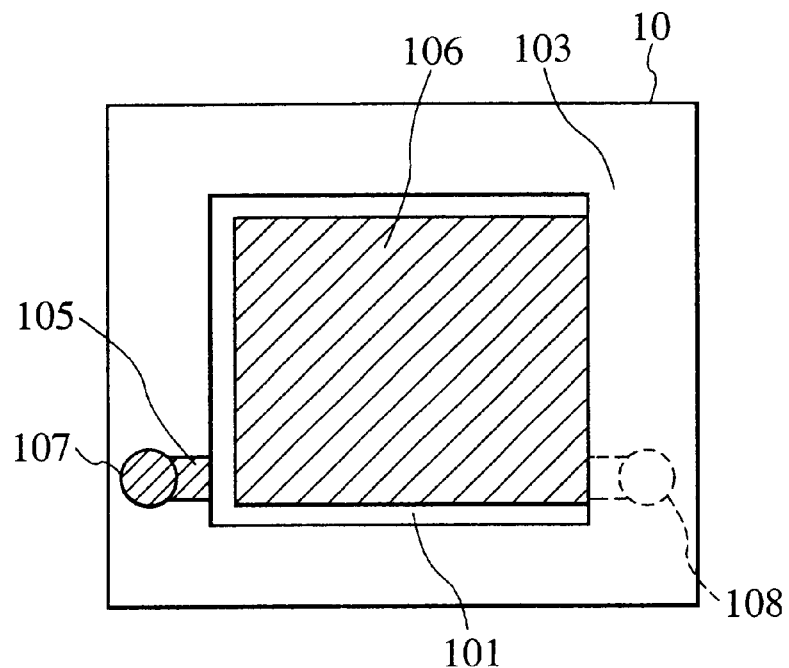
Figure 4B:
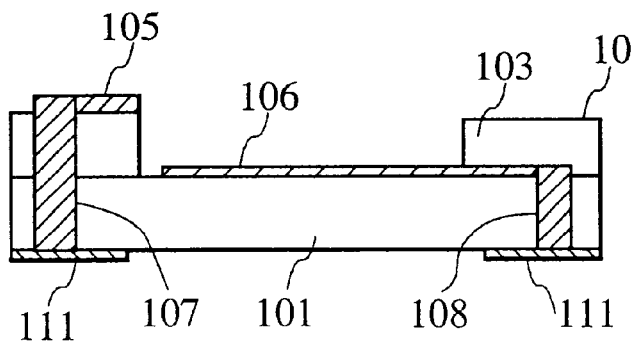

The step 103 which is formed from an insulating material, such as ceramic or a resin, is formed along the peripheral section of the bottom section 101, a shown in FIGS. 4A and 4B. The step 103 is formed as to be at the same height as the light emitting device 2. The through hole 107 which penetrates through the step 103 and the bottom section 101 and which reaches another one of the external electrodes 111. The conductive layer 105 is so formed on the step 103 as to cover the opening the through hole 107.

Figure 5A:
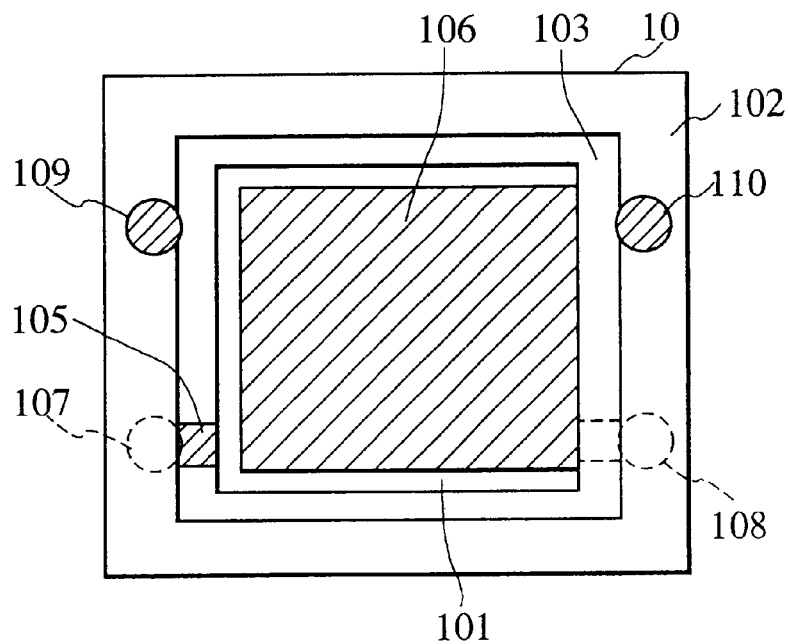
Figure 5B:
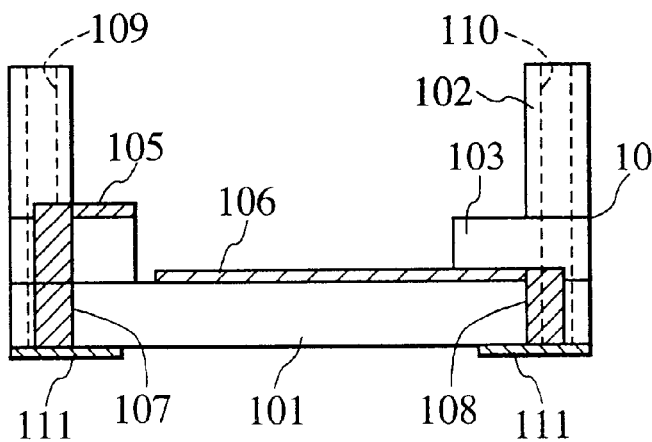

As illustrated in FIGS. 5A and 5B, the side wall 102 which is formed from an insulating material, such as ceramic or a resin is formed on the step 103. The through holes 109 and 110 which penetrate through the side wall 102, the step 103 and the bottom section 101 and which reach the rest of two external electrodes 111 are formed. Then, the through holes 109 and 110 are filled with the conductive material.

Accordingly, the substrate 10 is formed.

Figure 6A:
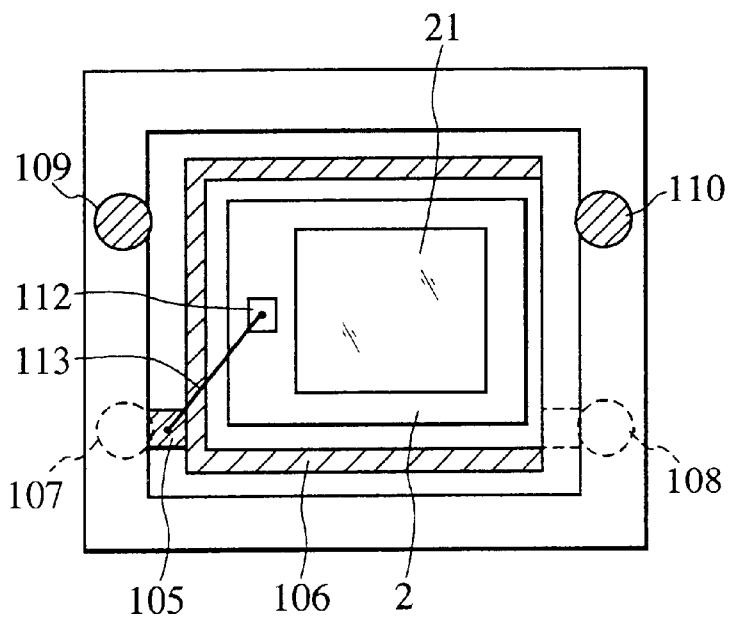
Figure 6B:
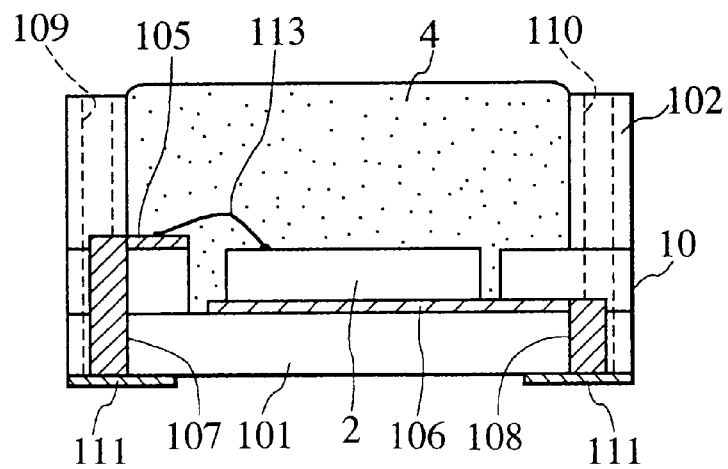

As illustrated in FIGS. 6A and 6B, the light emitting device 2 on the surface of which the electrode 112 and light emitting surface are formed is mounted on the conductive layer 106 using brazing metal or a conductive adhesive agent.

Subsequently, the electrode 112 of the light emitting device 2 and the conductive layer 105 on the step 103 are electrically connected through the bonding wire 113.

The substrate 10 is filled with translucent resin 4. At this time, the translucent resin 4 so fills the substrate 10 as to stand up slightly above the upper edge of the side wall 102.

A method of forming the cap 20 will now be explained with reference to FIGS. 7A to 8B.

Figure 7A:
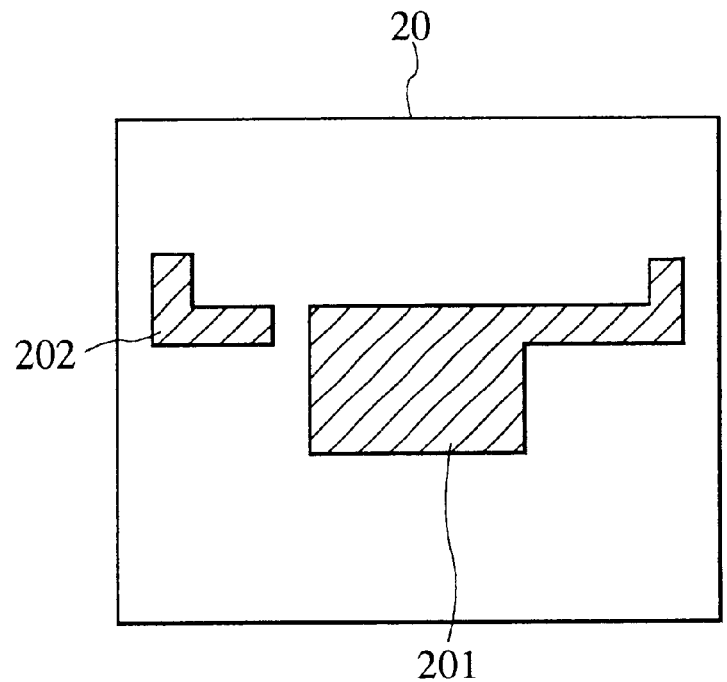
Figure 7B:
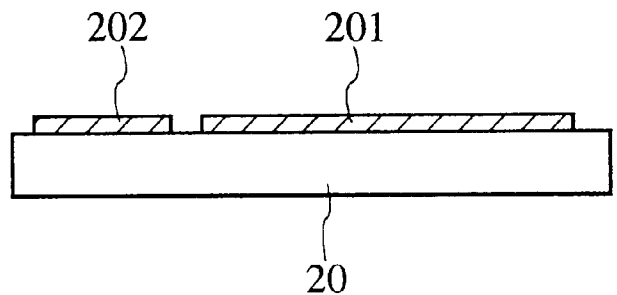

As illustrated in FIGS. 7A and 7B, a square-shaped plate which is formed from an insulating material, such as ceramic or a resin, is formed as the cap 20. One surface of the cap 20 is plated or metallized, then the conductive layer is patterned, thereby the conductive layers 201 and 202 which are insulated from each other are formed on the cap 20.

Figure 8A:
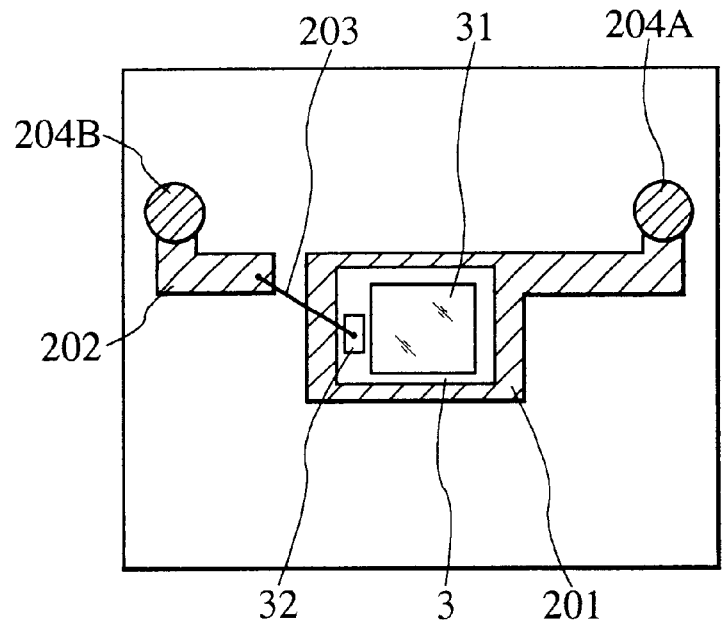
Figure 8B:
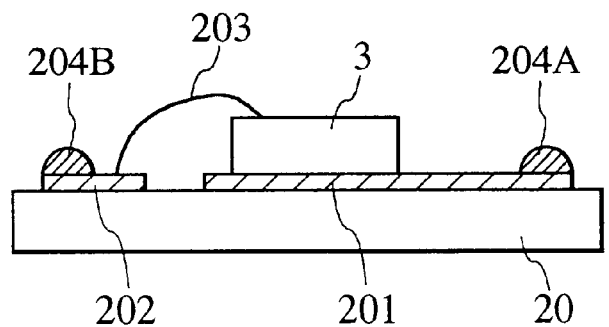

As described in FIGS. 8A and 8B, the photodetector 3 is mounted on the conductive layer 201 with brazing metal or a conductive adhesive agent. On the surface of the photodetector 3, an electrode 32 is formed. The electrode 32 and the conductive layer 202 are electrically connected with each other through the bonding wire 203.

When the cap 20 on the conductive layers 201 and 202 covers the opening of the substrate 10, the bumps 204A and 204B face the respective through holes 109 and 110 formed in the substrate 10.

In order to incorporate the substrate 10 together with the cap 20, the substrate 10 and the cap 20 are attached to each other and adjusted in their appropriate positions. By doing this, the photodetection surface 31 of the photodetector 3 faces the Light emitting surface 21 of the light emitting device 2, and the humps 204A and 204B face the respective through holes 109 and 110.

The arranged substrate 10 and the cap 20 are heated. The translucent resin 4 gets softer by being heated so that the cap 20 is adhered to the substrate 10 with the translucent resin 4 having sufficient adhesive strength to hold the substrate 10. The bump 204A and 204B are melted by being heated, thus the bumps 204A and 204B and the conductive materials inside the through holes 109 and 110 are electrically connected.

Accordingly, the photocoupler 1 illustrated in FIG. 1 is formed.

Figure 9:
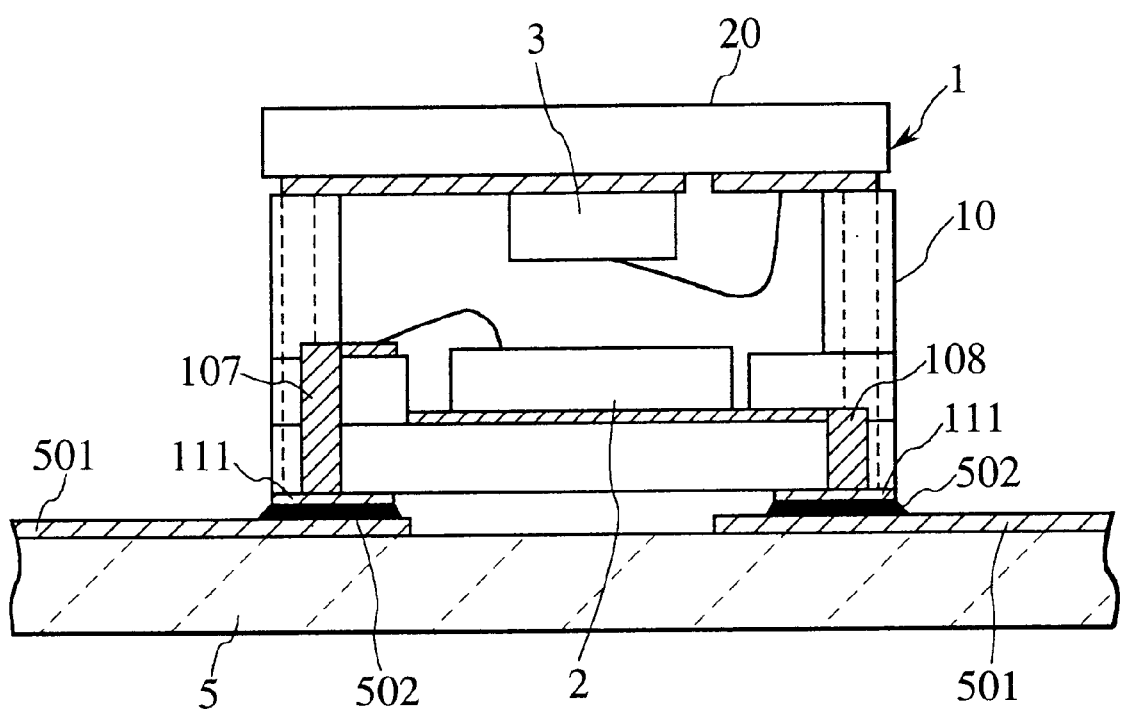
FIG. 9 is a diagram illustrating the optical semiconductor devices, illustrated in FIG. 1, in a state where the optical semiconductor device is mounted on a circuit structure.

A method of forming the photocoupler 1 on a circuit substrate will now he explained with reference to FIGS. 7A and 9.

Four solder layers 502 arc formed in four positions on wiring 501 of the circuit substrate 5. Those four solder layers 502 face the respective four external electrodes 111 of the photocoupler 1, and a reflow process is performed. As illustrated in FIG. 9, the photocoupler 1 is be mounted on the surface of the circuit substrate 5.

As explained above, in the photocoupler 1 according to the first embodiment, the light emitting device 2 and the photodetector 3 face each other, and the translucent resin 4 fills the space therethrough. In this structure, no interface exists between the light emitting device and the photodetector, thus light emitted from the light emitting device 2 is not reflected throughout the photocoupler 1 and is not scattered in directions. Therefore, efficiency of the photodetection of the photodetector 3 is high.

The electrode 112 of the light emitting device 2 and the conductive layer 105 of the substrate 10 are formed almost at the same height, the curvature of the loop can be low without the breaking of the bonding wire 113. In this structure, the light emitting device 2 and the photodetector 3 is arranged adjacent to each other. Thus, a short optical path length can be achieved between the light emitting device 2 and the photodetector 3, and the efficiency of the photodetection in the photodetector 3 can be high.

The through holes 107, 108, 109 and 110 formed in the substrate 10 serve as the wiring between the light emitting device 2 and the external electrode 111 and also between the photodetector 3 and the external electrode 111. Thus, a short wiring length can be achieved between the light emitting device 2 and the external electrode 111 and also between the photodetector 3 and the external electrode 111. This achieves a reduction in the wiring resistance or the wiring capacity, and enhances the efficiency of the light emission and the high-frequency characteristics.

In the photocoupler 1 according to the first embodiment, the light emitting device 2 and the photodetector 3 face each other, and the external electrodes 111 which are electrically connected to each other are arranged on one surface of the substrate 10. Hence, a plurality of photocouplers can be mounted with high density. Pointing out one actual example, the area of a photocoupler in which a light emitting device and a photodetector are arranged on one plane is 1.5×2.6 mm². In the case where the photocoupler 1 according to this embodiment is manufactured using the light emitting device 2 and the photodetector 3 having the same sizes as those employed in the above example, the actual area is 1.5×1.5 mm², achieving an approximately 40% reduction in the area.

In this first embodiment, the substrate 10 needs to be filled with the translucent resin 4 only once. Thus, the photocoupler 1 according to the present invention can be manufactured in fewer manufacturing processes than the manufacturing processes of manufacturing photocoupler, filled with both a translucent resin and a light-shielding resin or manufacturing photocouplers each having a light emitting device and a photodetector, both of which are formed in different processes. This results in high manufacturing efficiency.

The light emitting device 2 and the photodetector 3 are mounted respectively on the substrate 10 and the cap 20. In this structure, each of the light emitting device 2 and the photodetector 3 is individually be examined after being mounted thereon. Thus, the photocoupler can be formed selectively with the substrate 10 and the cap 20 with high quality. This achieves a high yield of the photocouplers.

Second Embodiment

Figure 10:
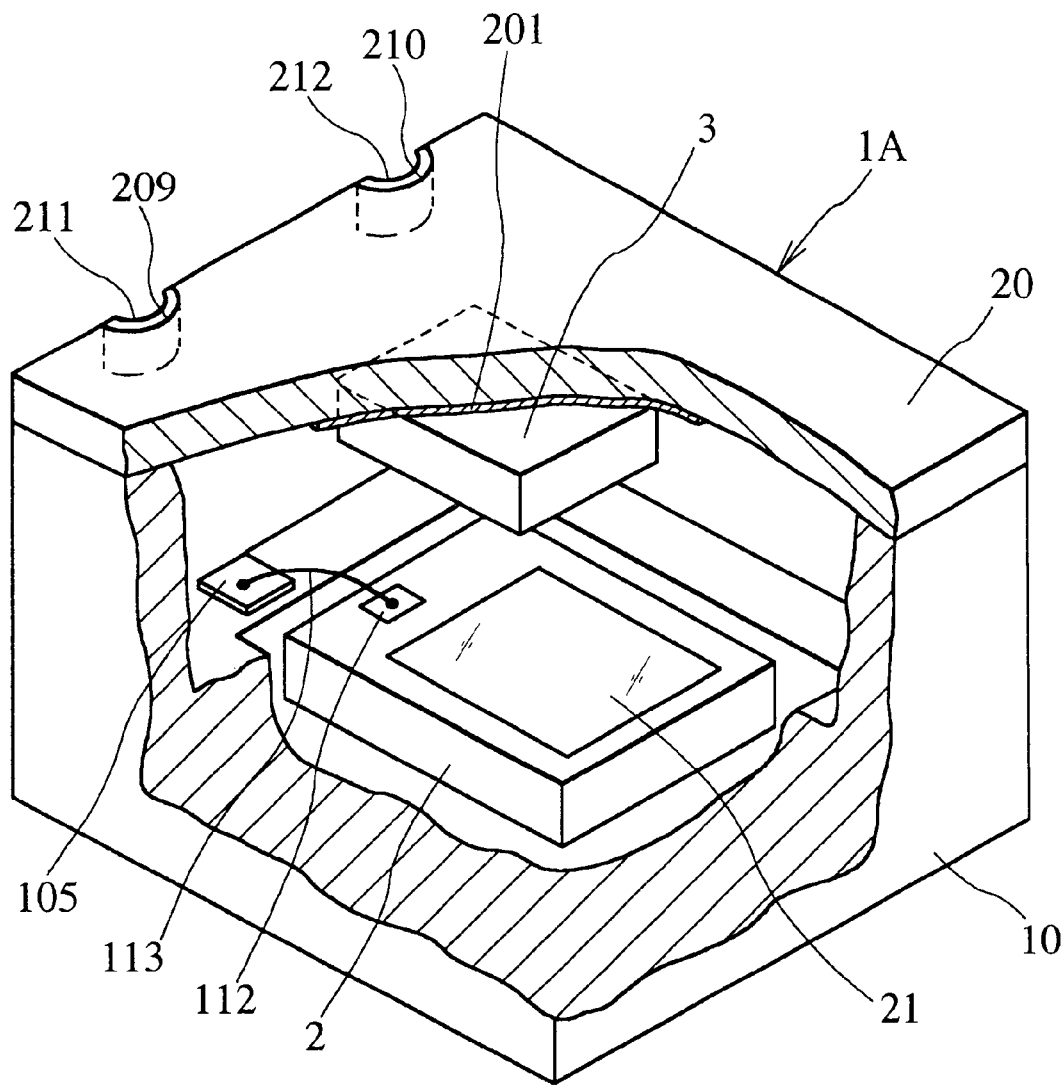
FIG. 10 is a perspective view of an optical semiconductor device according to the second embodiment of the present invention.
Figure 11A:
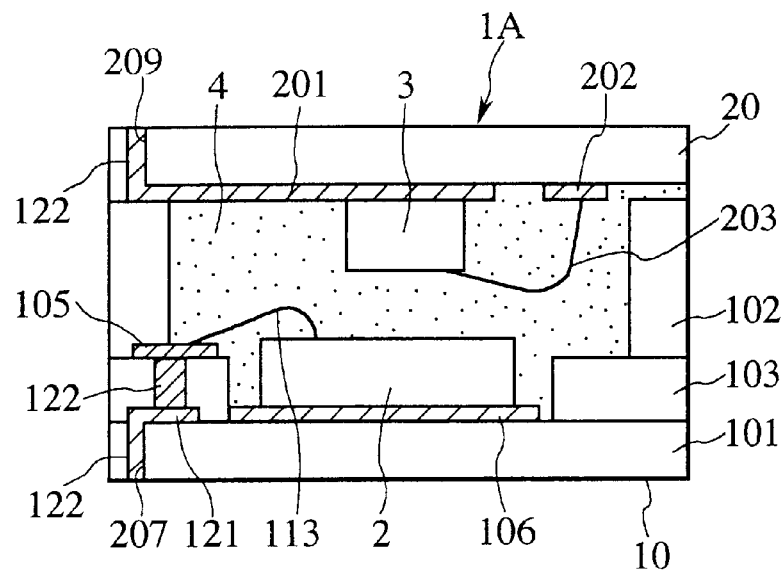
FIGS. 11A and 11B are a top view and a cross sectional view of the optical semiconductor device, in a manufacturing process, illustrated in FIG. 10.
Figure 11B:
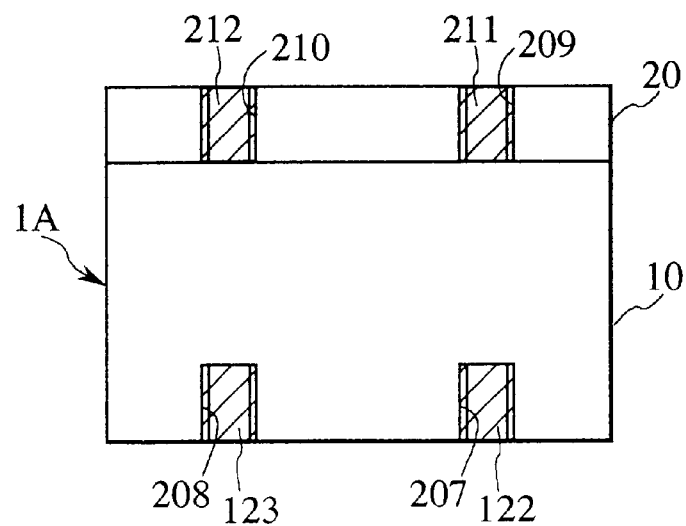

A photocoupler according to the second embodiment of the present invention will now be explained. FIG. 10 is a perspective view of a chip-type optical semiconductor device, according to the second embodiment of the present invention. FIG. 11A is a cross sectional view of the optical semiconductor device shown in FIG. 10, and FIG. 11B is a side view of the optical semiconductor device.

The optical semiconductor device (photocoupler) 1A according to the second embodiment has almost the same structure as that of the semiconductor device according to the first embodiment.

Explanations will now be made to differences in the photocouplers according to the first embodiment and the second embodiment. In the second embodiment, those same parts of the photocoupler will be denoted by the same reference numerals.

In the photocoupler 1A, the through holes 108, 109 and 110 are not included, and the external electrodes 111 are not even included.

In the first embodiment, the through hole 107 penetrates through the bottom section 101 and the step 103. However, in the second embodiment, as shown in FIG. 11A, the through hole 107 penetrates through only the step 103. A conductive layer 121 which is insulated from the conductive layer 106 is formed between the bottom section 101 and the step 103. The conductive layer 121 is electrically connected to the conductive layer 105 on the step 103 by the conductive material inside the through hole 107.

As illustrated in FIG. 11B, depressions 207, 208, 209 and 210 each in a semi-cylindrical shape are formed on one surface of the photocoupler 1A.

The depressions 207 and 208 are formed on one side surface of the substrate 10, whereas the depressions 209 and 210 are formed on one side surface of the cap 20.

External electrodes 122, 123, 211 and 212 are formed respectively on the surfaces of the depressions 207, 208, 209 and 210. The external electrode 122 formed in the depression 207 is connected to the conductive layer 121 formed between the bottom section 101 and the step 103. The external electrode formed in the depression 208 is connected to the conductive layer 106 on which the light emitting device 2 is mounted. The external electrode 211 formed in the depression 209 is connected to the conductive layer 201 on which the photodetector 3 is mounted.

The external electrode 212 formed in the depression 210 is connected to the conductive layer 202. The conductive layer 202 is connected to the electrode of the photodetector 3 via the bonding wire 203.

No bumps 2G4 are formed on the cap 20 in the photocoupler 1A.

A method of manufacturing the photocoupler 1A described in FIG. 10 will now be explained with reference to the drawings.

In this embodiment, likewise in the first embodiment, a plurality of substrates 10 and caps 20 having the same structure are formed in a matrix form, respectively. After the plurality of substrates 10 and caps 20 are formed in a matrix form, they are diced, thereby to form the individual substrates 10 and caps 20.

A method of forming the light emitting device 2 will now be explained with reference to FIGS. 12A, 12B, 13A and 13B.

Figure 12A:
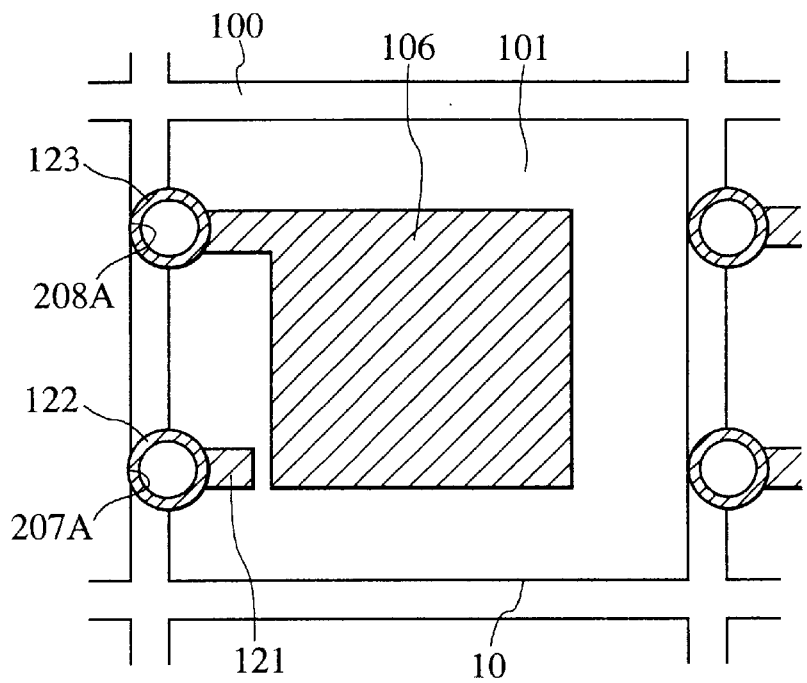
FIGS. 12A, 13A, 14A, 15A and 16A are top views of the optical semiconductor device, in a manufacturing process, illustrated in FIG. 10.
Figure 12B:
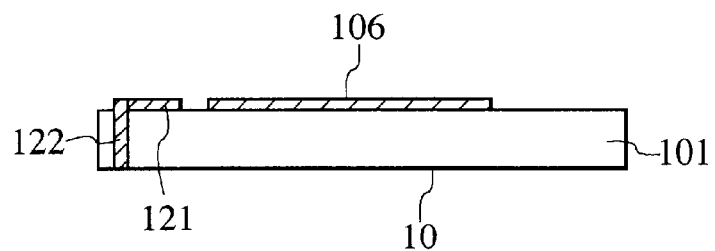
FIGS. 12B, 13B, 14B, 15B and 16B are cross sectional views of the optical semiconductor device, in a manufacturing process, illustrated in FIGS. 12A, 13A, 14A, 15A and 16A.

As described in FIGS. 12A and 12B, through holes 207A and 208A are formed in the junction of the bottom section 101 and a dicing area 100.

The through holes 207A and 208A are to be the depressions 207 and 208 each in a semi-cylindrical shape, by cutting down the dicing area 100 in a later process.

The bottom section 101 is plated or metallized, thereby to form the conductive layer 121, the external electrode 122 connected to the conductive layer 121, the conductive layer 106 and the external electrode 123 connected to the conductive layer 106.

Figure 13A:
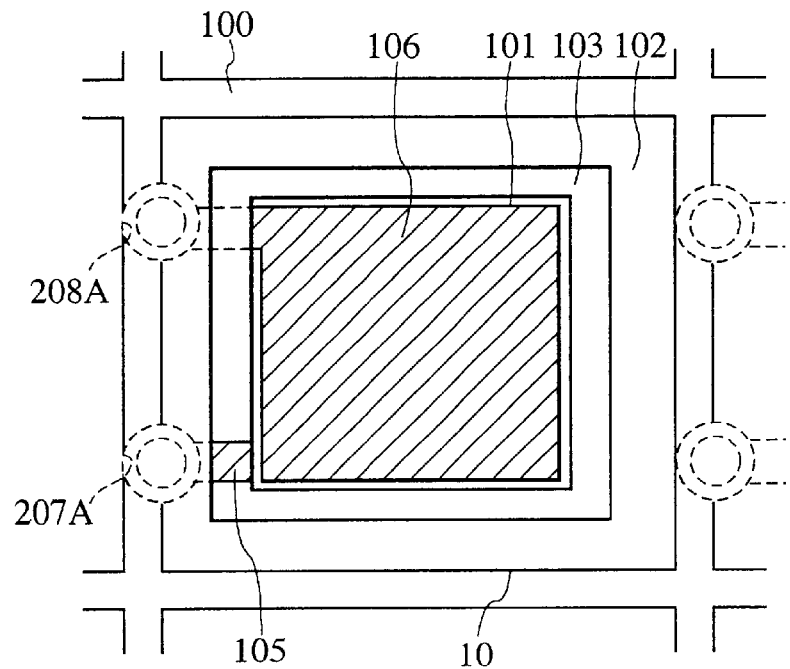
Figure 13B:
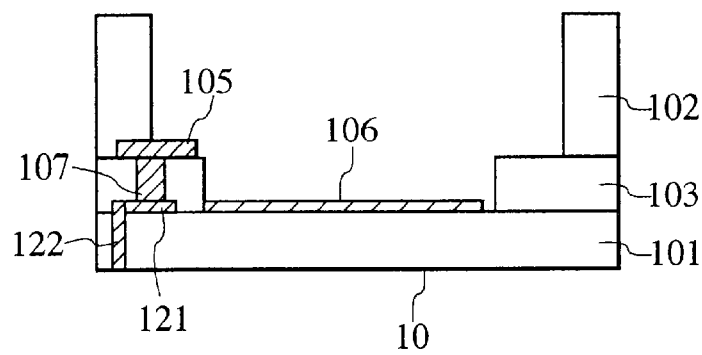

As illustrated in FIGS. 13A, 13D, the step 103 which is formed from an insulating material, such as ceramic and a resin, etc., is formed along the peripheral section of the bottom section 101. The through hole 107 reaching the conductive layer 121 is formed through the step 103. Further, the through hole 107 is filled with a conductive material. The conductive layer 105 is so formed on the step 103 as to cover the through hole 107. After this, the side wall 102 which is formed from ceramic or a resin, etc., is formed on the step 103.

Accordingly, the substrate 10 is formed.

Figure 14A:
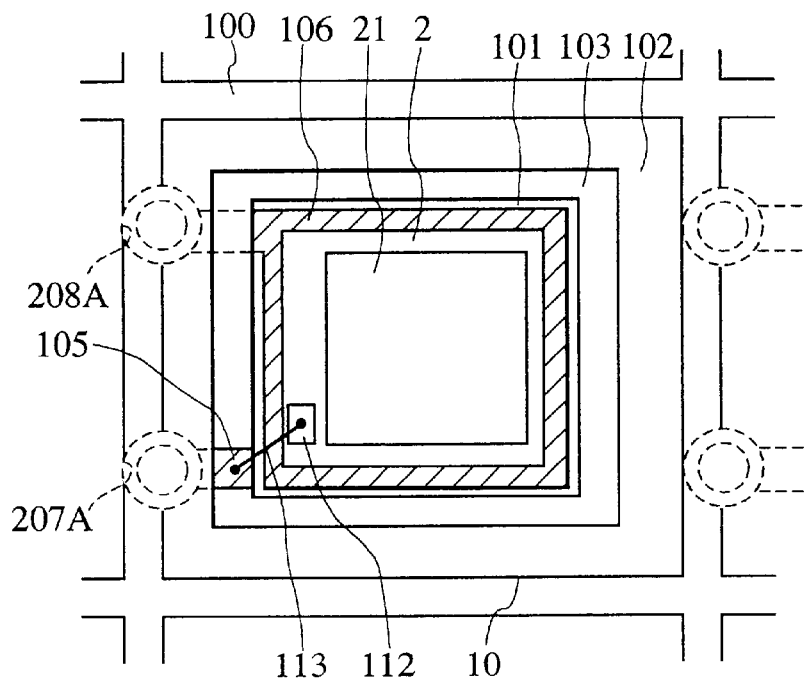
Figure 14B:
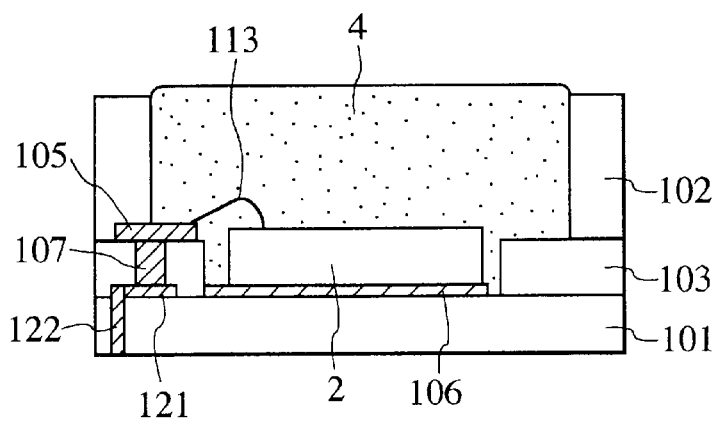

As described in FIGS. 14A and 14B, the light emitting device 2 is mounted on the conductive layer 106 using brazing metal or a conductive adhesive agent. Subsequently, the electrode 112 on the light emitting device 2 and the conductive layer 105 on the step 103 are electrically connected using the bonding wire 113.

After the light emitting device 2 is mounted on the conductive layer 106, the translucent resin 4 fills the substrate 10 as to stand up slightly above the upper edge of the side wall 102.

A method of arranging the photodetector 3 on the cap 20 will now be explained with reference to FIGS. 15A, 15B, 16A and 16B.

Figure 15A:
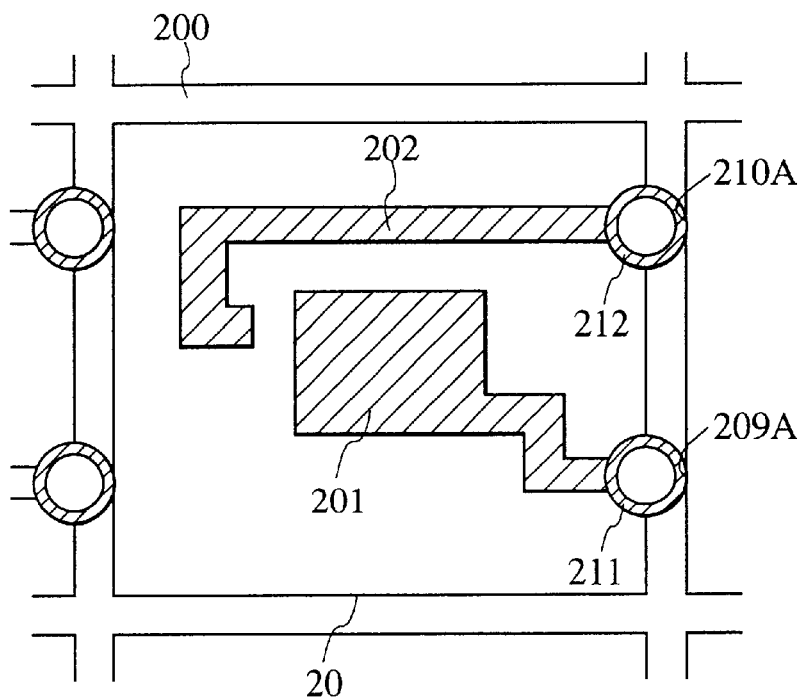
Figure 15B:
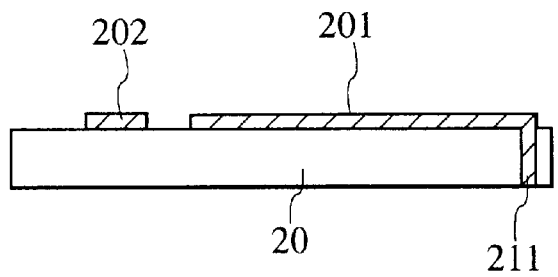

As shown in FIGS. 15A and 15B, a square-shaped plate formed from ceramic and a resin, etc. is employed as the cap 20. The through holes 209A and 210A are formed at the connection of the cap 20 and a dicing area 200. The through holes 209A and 210A are to be the depressions 209 and 210 each having a semi-cylindrical shape, by cutting the dicing area 200 in a later process.

The cap 20 is plated or metallized, thereby to form the conductive layer 201, the external electrode 211 connected to the conductive layer 201, the conductive layer 202, and the external electrode 212 connected to the conductive layer 202.

Figure 16A:
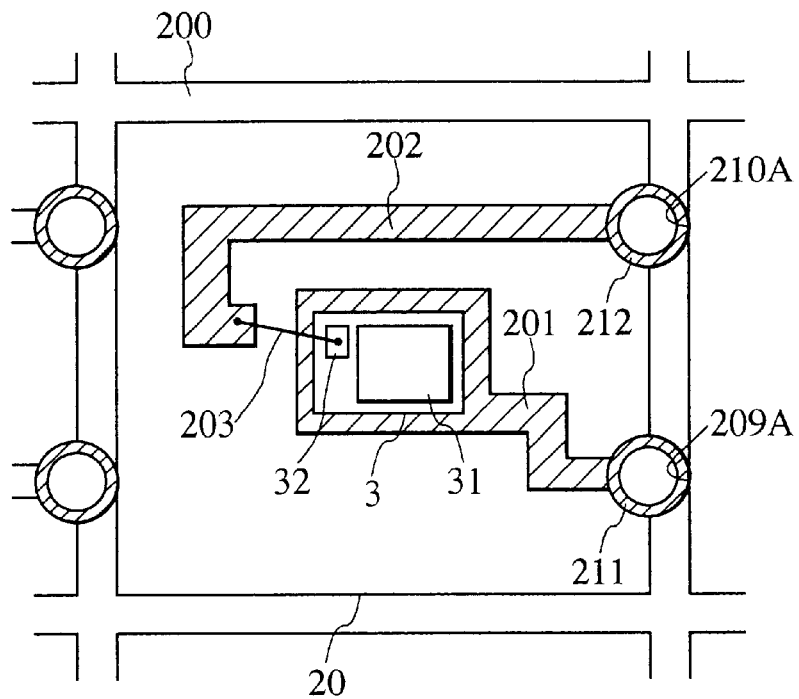
Figure 16B:
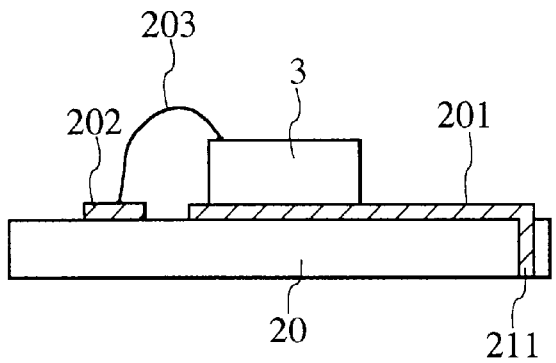

As described in FIGS. 16A and 16B, the photodetector 3 on which the electrode 32 is formed is mounted on the conductive layer 201 using brazing metal or a conductive adhesive agent. Subsequently, the electrode 32 and the conductive layer 202 are electrically connected to each other using the bonding wire 203.

In order to incorporate the substrate 10 together with the cap 20, the substrate 10 and the cap 20 are attached to each other and adjusted in appropriate positions. By doing this, the photodetection surface 31 of the photodetector 3 faces the light emitting surface 21 of the light emitting device 2. Further, the depressions 207 and 208 of the substrate 10 are arranged in positions corresponding to the positions of the depressions 209 and 210 of the cap 20, respectively, on the same plane. The adjusted substrate 10 and the cap 20 are heated while being pressurized. By this heat operation, the translucent resin 4 gets softer, and the cap 20 is adhered to the substrate 10 using the translucent resin 4 having sufficient adhesive strength to hold the cap 20.

Accordingly, the photocoupler 1A described in FIG. 10 is formed.

Figure 17:
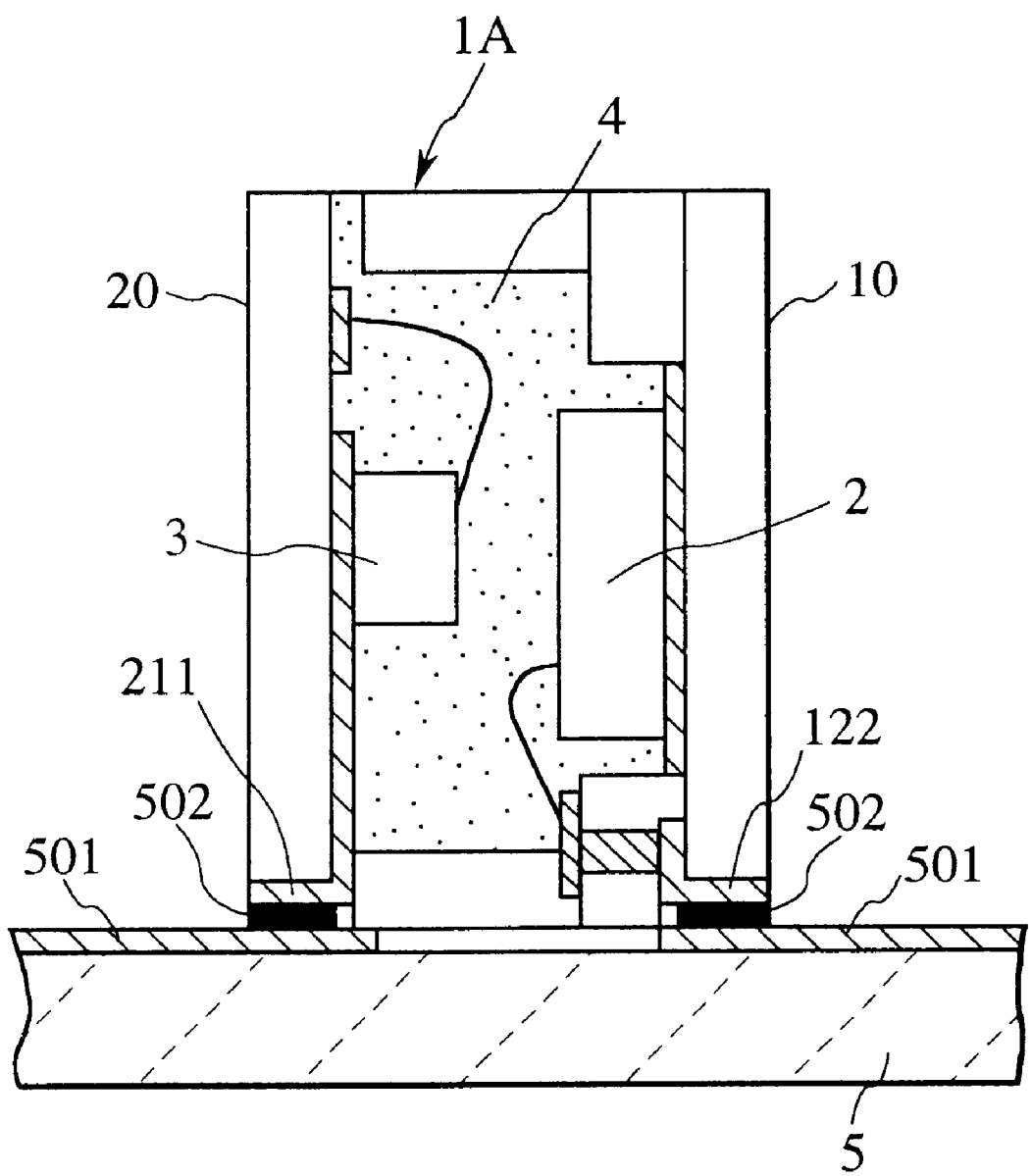
FIG. 17 is a diagram illustrating the optical semiconductor devices, illustrated in FIG. 10, in a state where the optical semiconductor device is mounted on a circuit substrate.

A method of forming the photocoupler 1A shown in FIG. 10 will now be explained with reference to FIG. 17.

In the case where the photocoupler 1A described in FIG. 10 is mounted on the surface of the circuit substrate 5, solders 502 are formed on the wiring 501 of the circuit substrate 5. The solder metals 502 face the external electrodes 111, and a reflow process is performed. Accordingly, as shown in FIG. 17, the photocoupler 1A can be mounted on the surface of the circuit substrate 5.

As explained above, in the second embodiment, the light emitting device 2 and the photodetector 3 are mounted on the circuit substrate 5 while their planes air arranged at right angles to the circuit substrate. Thus, in the case where the plane area of the photocoupler 1A is larger than the side of the surface area, a plurality of photocouplers 1A can be mounted on the circuit substrate 5, instead of arranging the electrode on the bottom surface. In this structure, a plurality of photocouplers 1A can be formed with high density.

For example, the area, where to mount a photocoupler on one plane of which a light emitting device and a photodetector are arranged, is 1.5×2.6 mm$^2$. However, if the photocoupler 1A according to the present invention is manufactured using a light emitting device 2 and the photodetector 3 respectively having the same sizes as the sizes of those light emitting device 2 and photodetector 3 used in the photocoupler 1A in the above example, the area where to mount the photocoupler is 1.5×1.0 mm$^2$, achieving an approximately 60% reduction in the area.

In the photocoupler 1A according to the second embodiment, the light emitting device 2 and the photodetector 3 face each other, and they are totally sealed with the translucent resin 4. Thus, light emitted from the light emitting device 2 is not reflected throughout the photocoupler 1A and is not scattered in directions, therefore, efficiency of the photodetection in the photodetector 3 is high.

The electrode 112 of the light emitting device 2 and the conductive layer 105 of the substrate 10 are formed almost at the same height, the curvature of the loop can be low without the breaking of the bonding wire 113. In this structure, the light emitting device 2 and the photodetector 3 can be arranged adjacent to each other. Further, a short optical path length can be achieved between the light emitting device 2 and the photodetector 3, and the efficiency of the photodetection in the photodetector 3 can be high.

In the photocoupler 1A according to the second embodiment, the external electrodes 122, 123, 211 and 212 from the light emitting device 2 and the photodetector 3 are wired through the utilization of the conductive layers 121 and 106 formed on the substrate 10 and the conductive layers 201 and 202 formed on the cap 20. This achieves a reduction in the wiring length and a reduction in the wiring resistance or the wiring capacity, and enhances the efficiency of the light emission and the high-frequency characteristics.

In the second embodiment, likewise in the first embodiment, the substrate 10 needs to be filled with the translucent resin 4 only once.

In the second embodiment, as described in the first embodiment, no bumps 4 need to be formed on the cap 2.

Third Embodiment

Figure 18A:
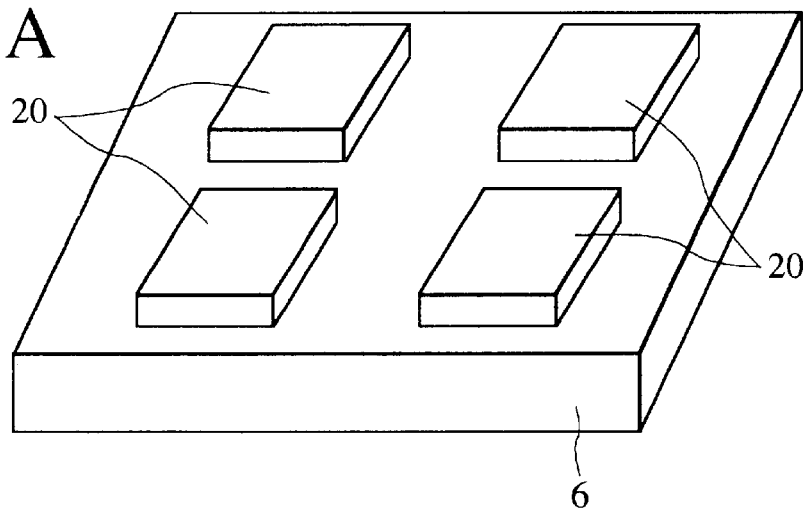
FIGS. 18A and 18B are a perspective view and a cross sectional view of an optical semiconductor device according to the third embodiment of the present invention.
Figure 18B:
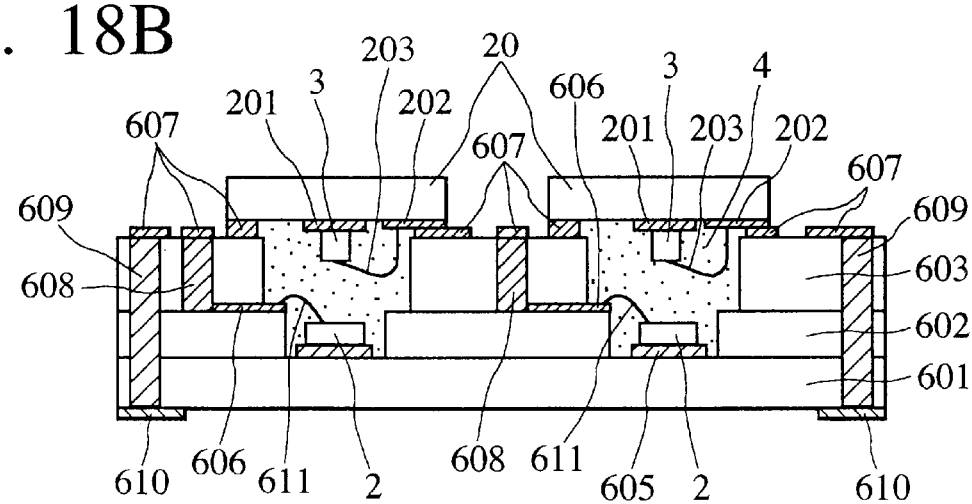

An optical semiconductor device according to the third embodiment will now be explained with reference to the drawings. FIGS. 18A and 18B are a perspective view and a cross sectional view of the optical semiconductor device as an optical integrated circuit having the MCM (Multi Chip Module) structure.

The optical semiconductor device according to this embodiment comprises, as shown in FIG. 18A, a wiring substrate 6 and a plurality of caps 20.

As illustrated in FIGS. 18A and 18B, the wiring substrate 6 comprises a bottom section 601, the first step 602 formed on the bottom section 601, and the second step 603 formed on the first steps 602. Each of the first and second steps 602 and 603 includes a plurality of openings each having a concavity 604 formed in the wiring substrate 6 (refer to FIGS. 20A and 20B). The size of the openings formed in the second step 603 is slightly larger than the size of the openings formed in the first step 602.

First conductive layers 605 having a predetermined wiring pattern are formed on the bottom section 601. The light emitting device 2 is formed on each of the first conductive layers 605.

Second conductive layers 606 having a predetermined wiring pattern are formed on the first step 602, and each of the second conductive layers 606 is electrically connected to an electrode of each light emitting device 2 through a bonding wire 611.

Third conductive layers 607 having a predetermined wiring pattern are formed on the second step 603.

Though holes 608 which electrically connect the second conductive layers 606 to the third conductive layers 607 are formed through the second step 603.

External electrodes 610 are formed on the back surface of the bottom section 601.

Through holes 609 penetrate through the bottom section 601, the first step 602 and the second step 603, and electrically connect the third conductive layers 607 and the external electrodes 610.

More through holes, as needed, are formed through the first step 602 and the second step 603. The first conductive layers 605, the second conductive layers 606 and the third conductive layers 607 are electrically connected respectively through those through holes.

Further, the concavities of the wiring substrate 6 are filled with the translucent resin 4.

The caps 20 are formed from dielectrics, such as a resin and the like. On one surface of each cap 20, the conductive layers 201 and 202 being insulated from each other are formed. The photodetector 3 is formed on the conductive layer 201. The conductive layer 202 is electrically connected to an electrode of the photodetector 3 through a bonding wire 203. A part of the conductive layer 202 faces one part of the third conductive layer 607 formed on the second step 603, when the cap 20 covers the concavity 604 of the wiring substrate 6.

The caps 20 respectively cover the concavities 604 of the wiring substrate 6, and are connected to the wiring substrate 6 with the translucent resin 4, filling the concavities 604, having sufficient adhesive strength to hold the caps 20.

As explained above, the optical semiconductor device according to the third embodiment comprise a plurality of photocouplers, each comprising the concavity 604 formed in the wiring substrate 6 and the cap 20 covering the concavity 604.

A method of manufacturing the optical semiconductor device described in FIGS. 18A and 18B will now be explained with reference to the drawings.

Figure 19:
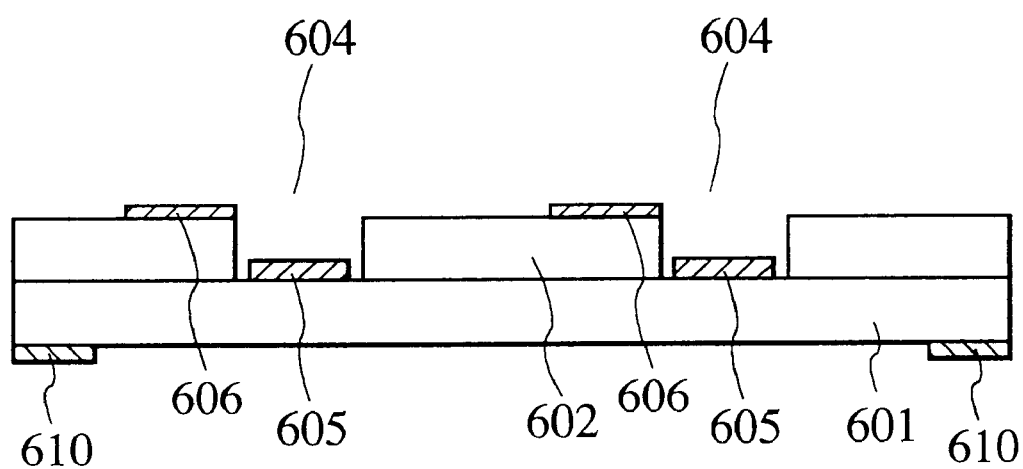
FIG. 19 is a cross sectional view of the optical semiconductor device, in a manufacturing process, illustrated in FIGS. 18A and 18B.
Figure 20A:
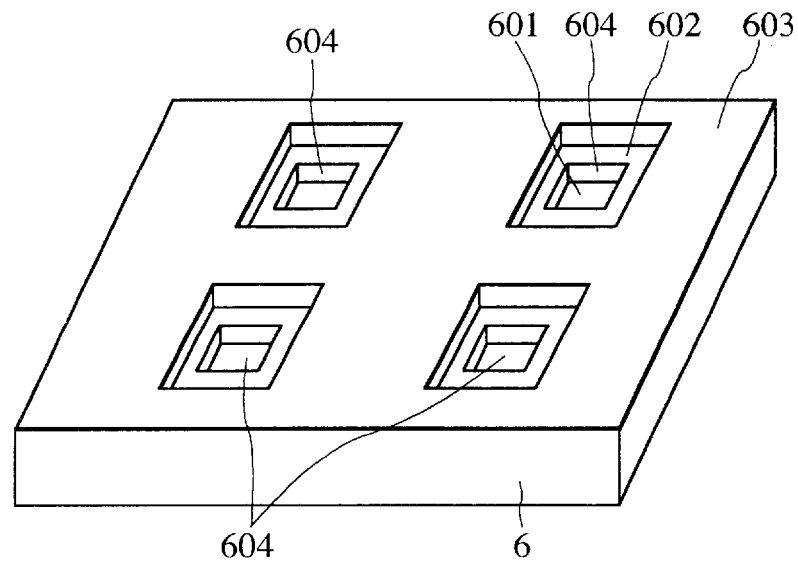
FIGS. 20A and 20B are a top view and a cross sectional view of the optical semiconductor device, in a manufacturing process, illustrated in FIGS. 18A and 18B.
Figure 20B:
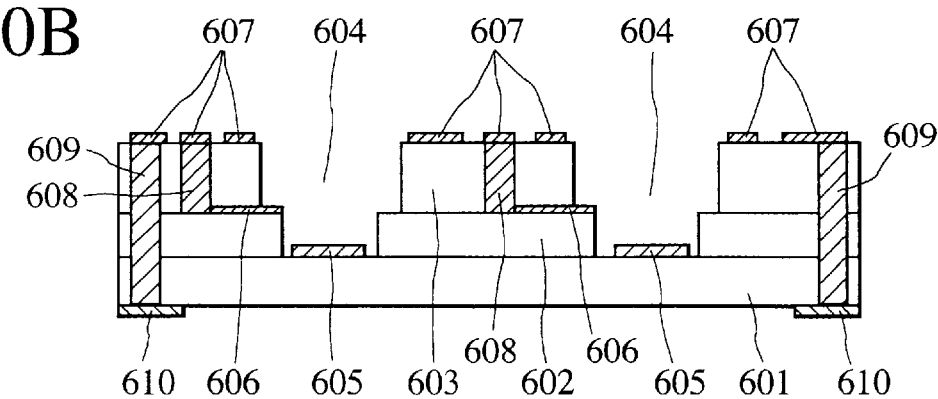
Figure 21:
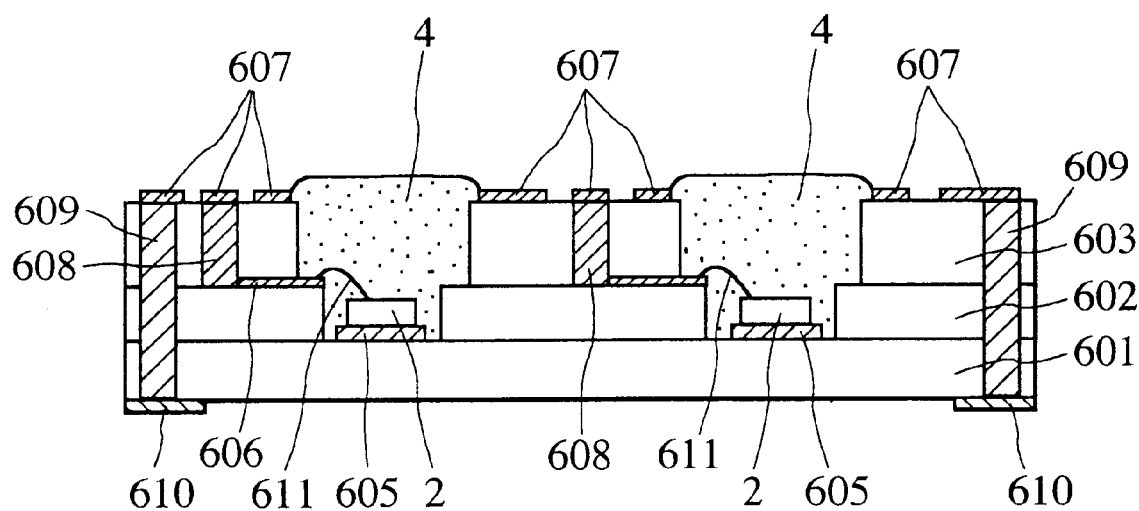
FIG. 21 is a cross sectional view of the optical semiconductor device, in a manufacturing process, illustrated in FIGS. 18A and 18B.

A method of forming the light emitting devices 2 on the wiring substrate 6, with reference to FIGS. 19 to 21.

As illustrated in FIG. 19, a dielectric member, such as a resin, etc., serves as the bottom section 601, the external electrodes 610 are formed in predetermined positions on one surface of the bottom section 601.

The first step 602 which includes a plurality of openings and which is formed of a dielectric member, such as a resin or the like, is formed on the bottom section 601 on which the first conductive layers 605 are formed the second conductive layers 606 having a predetermined wiring pattern are formed on the first step 602.

As described in FIGS. 20A and 20B, the second step 603, which includes a plurality of openings in same positions as those Of the first step 602, and which is formed from a dielectric member, such as a resin or the like, is formed on the first step 602 on which the second conductive layers 606 are formed. By doing this, there am formed the bottom section 601 and the concavities 604, each of which is formed by the first step 602 and the second step 603. At this time, the size of the openings of the second step 603 is slightly larger than the size of the openings of the first step 602. In this structure, a part of each second conductive layer 606 in the inside of each concavity 604.

The through holes 608 which reach the second conductive layers 606 are formed through the second step 603, and the through holes 609 which reach the external electrodes 601 are formed throughout the bottom section 601, the first step 602 and the third step 603.

The third conductive layers 607 having a predetermined pattern are formed on the second step 603. At this time, some of the third conductive layers 607 are connected to the through holes 608 or 609.

More through holes, as needed, are formed through the first step 602 and the second step 603. The first conductive layers 605, the second conductive layers 606 and the third conductive layers 607 are electrically connected respectively through those through holes. Each of those through holes is filled with a conductive material.

As described in FIG. 21, the light emitting devices 2 arc mounted respectively on the first conductive layers 605 inside the concavities 604, using brazing metal or a conductive adhesive agent. Subsequently, each of the light emitting devices 3 is connected respectively to an appearing part of the second conductive layer 606 through the bonding wire 611.

After the light emitting devices 2 are mounted, each of the concavities 604 is filled with the translucent resin 4. At this time, the translucent resin 4 fills the concavity 604 as to stand up slightly above the upper edge of the concavity 604.

A method of arranging the cap 20 will now be explained.

Likewise in the first and second embodiments, a dielectric member, such as a resin or the like, serves as the cap 20, and the conductive layers 201 and 202 having a predetermined pattern and being insulated from each other are formed on one surface of the cap 20. Subsequently, the photodetector 3 is mounted on the conductive layer 201 using brazing metal or a conductive adhesive agent. Further, the photodetector 3 and the conductive layer 202 are electrically connected through the bonding wire 203.

In order to incorporate the wiring substrate 6 together with the cap 20, the wiring substrate 6 and the cap 20 are attached to each other and adjusted in appropriate positions. By doing this, the photodetection surface 31 of the photodetector 3 faces the photodetection surface 21 of the photodetector 2. The adjusted wiring substrate 6 and the cap 20 are heated. By this heat treatment, the translucent resin 4 gets softer, and the cap 20 is adhered to the wiring substrate 6 with the translucent resin 4 having sufficient adhesive strength to hold the cap 20.

Accordingly, the optical semiconductor device illustrated in FIGS. 18A and 18B is formed.

Figure 22A:
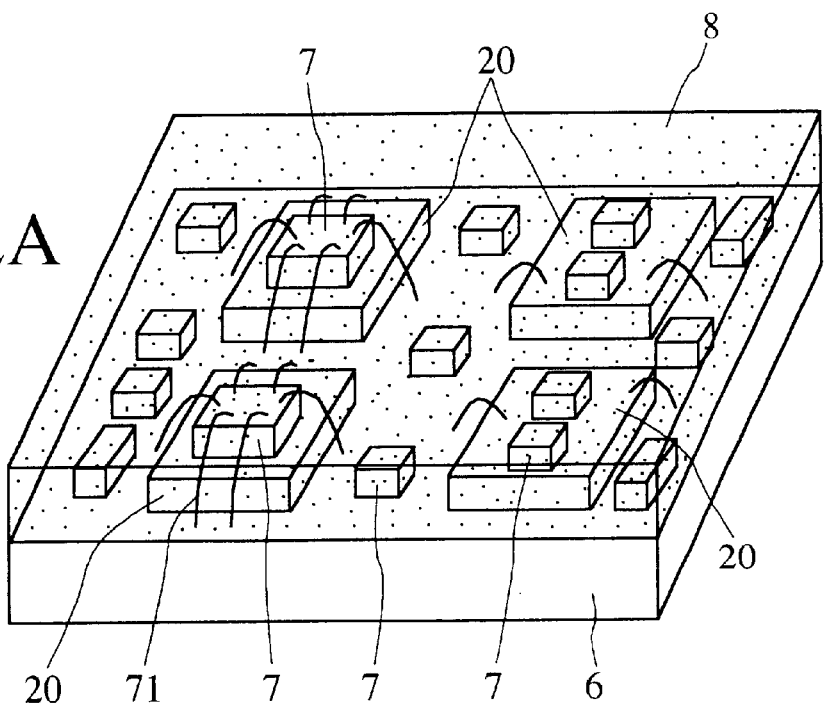
FIGS. 22A and 22B are a perspective view and a cross sectional view of the optical semiconductor device, illustrated in FIGS. 18A and 18B, wherein electronic components are mounted.
Figure 22B:
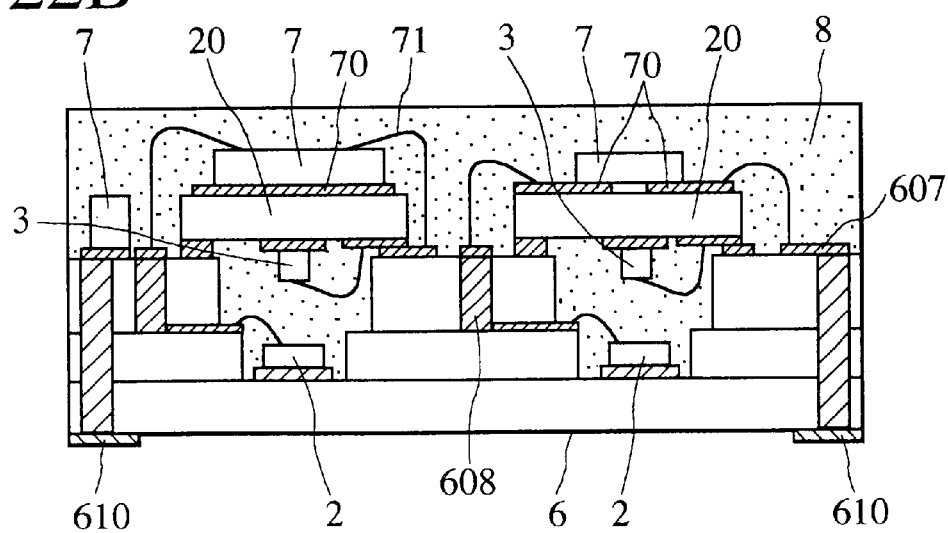

Explanations will now be made a method for arranging an electronic component on the top surface of the cap 20 and the top surface of the wiring substrate 6. Such arrangement is made for efficient use of the top surfaces of the cap 20 and the wiring substrate 6, as illustrated in FIGS. 22A and 22B.

For example, in the case where the electronic component 7 is mounted on the lop surface of the cap 20, a conductive layer 70 is formed on the cap 20. A semiconductor device or the electronic component 7 including any type of a chip component is mounted on the conductive layer 70, and is electrically connected to the third conductive layer 607 though a bonding wire 71.

In the case where the electronic component 7 is mounted on the top surface of the wiring substrate 6, the semiconductor device or the electronic component 7 including any chip component is mounted on the top surface of the third conductive layer 607.

After the electronic component 7 is mounted on the cap 20 and the wiring substrate 6, the entire surface of the wiring substrate 6 including the caps 20 and the electronic components 7 is sealed with a sealing resin 8.

As explained above, in the optical semiconductor device according to the third embodiment, the light emitting device 2 and the photodetector 3 in each photocoupler face each other. In this structure, the area of each photocoupler on the wiring substrate 6 can be made small. Thus, the optical semiconductor devices can be highly integrated.

In the optical semiconductor device according to the third embodiment, the light emitting device 2 and the photodetector 3 are totally sealed with the translucent resin 4. In this structure, light emitted from the light emitting device 2 is not reflected throughout the optical semiconductor device or is not scattered in directions, resulting in high efficiency of the photodetection of the photodetector 3.

In the optical semiconductor device according to the third embodiment, photocoupling is achieved between the light emitting device 2 and the photodetector 3 in each photocoupler, the simple structure of the optical semiconductor device can be made, as compared to any optical semiconductor device, wherein photocoupling is performed using a transparent plate, etc. Further, the thickness or the device can be low.

In the third embodiment, three layers of dielectric plates (bottom section 601, the first and second steps 602 and 603) are stacked one on another, thereby to form the wiring substrate 6. However, four or more layers of dielectric plates can be employed. Having employed a number of layers, an optical integrated circuit having the complicated MCM structure can be realized.

As explained, in the first to third embodiments, the light emitting device 2 is mounted on the substrate 10 or the wiring substrate 6, and the photodetector 3 is mounted on the cap 20. However, the photodetector 3 can be mounted on the substrate 10 or the wiring substrate 6, and the light emitting device 2 can be mounted on the cap 20.

In the first to third embodiments, the translucent resin 4 fills the space throughout the substrate 10 and the cap 20 or throughout the wiring substrate 6 and the cap 20. However, the same effect as the present invention can be obtained even if the translucent resin 4 does not fill the space therethrough. In such a case, the substrate 10 or the wiring substrate 6 and the cap 20 are adhered to each other in an airtight manner using an adhesive agent, etc.

In the third embodiment, as illustrated in FIGS. 22A, 22B, in the case where the entire surface of the wiring substrate 6 is sealed using the sealing agent 8, it is not necessary that the translucent resin 4 fills the space throughout the wiring substrate 6 and the cap 20.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to he in the scope of the present invention.

This application is based on Japanese Patent Application No. H11-229024 filed on Aug. 13, 1999, and including specification, claims, drawings and summary. The disclosure of the above Japanese Patent Application is incorporated herein by reference in its entirety.

What is claimed is:

1. An optical semiconductor device comprising:

a substrate having an opening;

a conductive layer formed on a bottom surface of said substrate;

a plurality of external electrodes formed on an external surface of said substrate;

a light emitting device or photodetector which is mounted on said conductive layer of said substrate and electrically connected to said conductive layer and said external electrodes;

a cap, including a top surface and a lower surface, the lower surface including a substantially continuously planar surface section which overlays the opening of said substrate and extends beyond the opening;

a conductive layer formed on the lower surface of said cap facing said light emitting device or photodetector on said bottom surface of said substrate; and a photodetector or light emitting device, which is mounted on said conductive layer of said cap, and electrically connected to said conductive layer of said cap and said plurality of external electrodes, and facing said light emitting device or photodetector mounted on said bottom surface of said substrate.

2. The optical semiconductor device according to claim 1, wherein a space throughout said substrate and said cap is filled with a translucent resin.

3. The optical semiconductor according to claim 1, further comprising:

at least one through hole formed in said substrate, for connecting said conductive layer of said substrate and said plurality of external electrodes, and said at least one through hole is filled with a conductive material.

4. An optical semiconductor device comprising:

a substrate having an opening, in a form of a container;

a conductive layer of said substrate which is formed on a bottom surface of said substrate;

a plurality of external electrodes which are formed on an external surface of said substrate and to be electrically connected to an external circuit;

a light emitting device or photodetector which is mounted on said conductive layer of said substrate and electrically connected to said conductive layer and said external electrodes;

a cap which is fixed to an opening of said substrate;

a conductive layer of said cap which is formed on a surface of said cap facing said light emitting device or photodetector on said bottom surface of said substrate; and a photodetector or light emitting device, which is mounted on said conductive layer of said cap, and electrically connected to said conductive layer of said cap and said plurality of external electrodes, and which faces said light emitting device or photodetector mounted on said bottom surface of said substrate, wherein:

at least one through hole for said cap, for connecting said conductive layer of said cap and said plurality of electrodes, is formed in said substrate; and said at least one through hole for said cap is filled with a conductive material.

5. The optical semiconductor device, according to claim 1, wherein:

said substrate comprises a bottom section and a side wall arranged on a peripheral section of the bottom section; and said plurality of external electrodes are formed on the bottom surface of said substrate.

6. The optical semiconductor device according to claim 1, wherein:

said substrate comprises a bottom section and a side wall arranged on a peripheral section of the bottom section;

said cap further includes a side surface section; and said plurality of external electrodes are arranged on the side wall section of said substrate and on the side surface section.

7. An optical semiconductor device comprising:

a substrate having an opening, in a form of a container;

a conductive layer of said substrate which is formed on a bottom surface of said substrate;

a plurality of external electrodes which are formed on an external surface of said substrate and to be electrically connected to an external circuit;

a light emitting device or photodetector which is mounted on said conductive layer of said substrate and electrically connected to said conductive layer and said external electrodes;

a cap which is fixed to an opening of said substrate;

a conductive layer of said cap which is formed on a surface of said cap facing said light emitting device or photodetector on said bottom surface of said substrate; and a photodetector or light emitting device, which is mounted on said conductive layer of said cap, and electrically connected to said conductive layer of said cap and said plurality of external electrodes, and which faces said light emitting device or photodetector mounted on said bottom surface of said substrate, wherein:

said substrate has a multi-layer structure;

a first conductive layer is formed on a predetermined layer of said substrate;

said light emitting device or photodetector is formed on said first conductive layer;

a second conductive layer is formed on a layer being at the same height as a height of a surface of said light emitting device or photodetector formed on said first conductive layer; and said light emitting device or photodetector and said second conductive layer are electrically connected with each other through a bonding wire.

8. An optical semiconductor device comprising:

a substrate having an opening, in a form of a container;

a conductive layer of said substrate which is formed on a bottom surface of said substrate;

a plurality of external electrodes which are formed on an external surface of said substrate and to be electrically connected to an external circuit;

a light emitting device or photodetector which is mounted on said conductive layer of said substrate and electrically connected to said conductive layer and said external electrodes;

a cap which is fixed to an opening of said substrate;

a conductive layer of said cap which is formed on a surface of said cap facing said light emitting device or photodetector on said bottom surface of said substrate; and a photodetector or light emitting device, which is mounted on said conductive layer of said cap, and electrically connected to said conductive layer of said cap and said plurality of external electrodes, and which faces said light emitting device or photodetector mounted on said bottom surface of said substrate, wherein:

said plurality of external electrodes are formed on the external surface of said substrate, and on an external surface of said cap;

said plurality of external electrodes which are formed on the external surface of said substrate, and said plurality of external electrodes which are formed on the external surface of said cap are arranged on a same plane;

a plurality of external electrodes which are formed on the external surface of said substrate are electrically connected to said light emitting device or photodetector on said conductive layer for substrate; and said plurality of external electrodes which are formed on the external surface of said cap are electrically connected to said photodetector or light emitting device on said conductive layer for said cap.

9. An optical semiconductor comprising:

a wiring substrate, on which a conductive layer of said substrate have a predetermined wiring pattern is formed, and which has a plurality of openings in predetermined positions;

a plurality of external electrodes which are formed on an external surface of said wiring substrate and to be electrically connected to an external circuit;

a light-emitting device or photodetector which is mounted on said conductive layer and said external electrodes;

a plurality of caps, each including a top surface and a lower surface, wherein the lower surface of at least one of the plurality of caps includes a substantially continuously planar surface section which overlays at least one of the openings of said substrate and extends beyond the at least one of the openings;

a conductive layer of at least one of said plurality of caps which is formed on the lower surface of said at least one of said plurality of caps facing said light emitting device or photodetector on said conductive layer of said substrate; and a photodetector or light emitting device, which is mounted on said conductive layer of said at least one of said plurality of caps, and electrically connected to said conductive layer of said cap and said plurality of external electrodes, and which faces said light emitting device of photodetector mounted on said substrate.

10. The optical semiconductor device according to claim 9, wherein a space throughout said each of said plurality of openings and said cap is filled with a translucent resin.

11. The optical semiconductor device according to claim 9, further comprising:

at least one through hole formed in said substrate, for connecting said conductive layer of said substrate and said plurality of external electrodes, and said at least one through hole is filled with a conductive material.

12. An optical semiconductor comprising:

a wiring substrate, on which a conductive layer of said substrate have a predetermined wiring pattern is formed, and which has a plurality of openings in predetermined positions;

a plurality of external electrodes which are formed on an external surface of said wiring substrate and to be electrically connected to an external circuit;

a light-emitting device or photodetector which is mounted on said conductive layer and said external electrodes;

caps, which are each fixed to one of the openings of said substrate;

a conductive layer of at least one of said caps which is formed on a surface of said at least one of said caps, facing said light emitting device or photodetector on said conductive layer of said substrate; and a photodetector or light emitting device, which is mounted on said conductive layer of at least one of said caps, and electrically connected to said conductive layer of said at least one of said caps and said plurality of external electrodes, and which faces said light emitting device of photodetector mounted on said substrate, further comprising:

at least one through hole for said at least one of said caps, for connecting said conductive layer of said at least one of said caps and said plurality of electrodes, is formed in said substrate; and said at least one through hole for said at least one of said caps is filled with a conductive material.

13. An optical semiconductor comprising:

a wiring substrate, on which a conductive layer of said substrate have a predetermined wiring pattern is formed, and which has a plurality of openings in predetermined positions;

a plurality of external electrodes which are formed on an external surface of said wiring substrate and to be electrically connected to an external circuit;

a light-emitting device or photodetector which is mounted on said conductive layer and said external electrodes;

caps, which are each fixed to one of the openings of said substrate;

a conductive layer of at least one of said caps which is formed on a surface of at least one of said caps facing said light emitting device or photodetector on said conductive layer of said substrate; and a photodetector or light emitting device, which is mounted on said conductive layer of said at least one of said caps, and electrically connected to said conductive layer of said at least one of said caps and said plurality of external electrodes, and which faces said light emitting device of photodetector mounted on said substrate, wherein:

said substrate has a multi-layer structure;

a first conductive layer is formed on a predetermined layer of said substrate;

a second conductive layer is formed on a layer being at a same height as a height of a top surface of said light emitting device or photodetector formed on said first conductive layer; and said light emitting device or photodetector formed on second conductive layer are electrically connected through a bonding wire.

14. An optical semiconductor device comprising:

a concave substrate having a plurality of openings in predetermined positions;

a first conductive layer having a predetermined wiring pattern disposed on an interior surface of said concave substrate;

a plurality of external electrodes disposed on an external surface of said concave substrate, the external electrodes being electrically connected to an external circuit;

a first optical element disposed on said first conductive layer of said concave substrate, the first optical element being selected from the group consisting of a light emitting device and a photodetector, and being electrically connected to said first conductive layer of said concave substrate and to said plurality of external electrodes;

a substantially horizontal cap which is fixed to a top surface of said concave substrate;

a second conductive layer having a predetermined wiring pattern disposed on a surface of said cap facing said interior surface of said concave substrate; and a second optical element disposed on said second conductive layer of said cap, the second optical element being selected from the group consisting of a light emitting device and a photodetector, and being electrically connected to said second conductive layer of said cap and to said plurality of external electrodes;

wherein said first conductive layer of said concave substrate is electrically connected to said plurality of external electrodes through at least one first through-hole which comprises a first corresponding one of said openings in said concave substrate and which is filled with a conductive material, and wherein said second conductive layer of said cap is electrically connected to said plurality of external electrodes through at least one second through-hole, which comprises a second corresponding one of said openings in said concave substrate and which is filled with a conductive material.

15. The optical semiconductor device according to claim 14, wherein the concave substrate has a rhomboid shape.

16. The optical semiconductor device according to claim 14, wherein a space between said concave substrate and said cap is filled with a translucent resin.

* * * * *